(12) United States Patent
Shin et al.

(10) Patent No.: US 12,046,589 B2
(45) Date of Patent: Jul. 23, 2024

(54) DISPLAY APPARATUS HAVING DISPLAY MODULE AND METHOD OF MANUFACTURING THE SAME

(71) Applicant: SAMSUNG ELECTRONICS CO., LTD., Suwon-si (KR)

(72) Inventors: Seonghwan Shin, Suwon-si (KR); Sungsoo Jung, Suwon-si (KR); Hyeongik Kim, Suwon-si (KR); Yonghan Yoon, Suwon-si (KR); Kwangjae Lee, Suwon-si (KR); Chiwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 17/561,084

(22) Filed: Dec. 23, 2021

(65) Prior Publication Data
US 2022/0199594 A1 Jun. 23, 2022

Related U.S. Application Data

(63) Continuation of application No. PCT/KR2021/019457, filed on Dec. 21, 2021.

(30) Foreign Application Priority Data

Dec. 23, 2020 (KR) .................. 10-2020-0182627

(51) Int. Cl.
*H01L 25/13* (2006.01)
*H01L 25/075* (2006.01)
*H01L 33/62* (2010.01)

(52) U.S. Cl.
CPC .......... *H01L 25/13* (2013.01); *H01L 25/0753* (2013.01); *H01L 33/62* (2013.01); *H01L 2933/0066* (2013.01)

(58) Field of Classification Search
CPC ..... H01L 25/13; H01L 25/0753; H01L 33/62; H01L 2933/0066; H01L 25/167;
(Continued)

(56) References Cited

U.S. PATENT DOCUMENTS

| 9,759,944 B2 | 9/2017 | Kim |
| 9,966,000 B2 | 5/2018 | Fan et al. |

(Continued)

FOREIGN PATENT DOCUMENTS

| EP | 4 141 527 A1 | 3/2023 |
| KR | 10-2017-0040205 A | 4/2017 |

(Continued)

OTHER PUBLICATIONS

Communication dated Apr. 20, 2022, issued by the International Searching Authority in counterpart International Application No. PCT/KR2021/019457 (PCT/ISA/210).
(Continued)

*Primary Examiner* — J. E. Schoenholtz
(74) *Attorney, Agent, or Firm* — Sughrue Mion, PLLC

(57) ABSTRACT

Provided is a display module including: a substrate including a mounting surface on which a plurality of inorganic light emitting diodes (LEDs) are mounted, a side surface, and a rear surface disposed opposite to the mounting surface; a front cover bonded to and covering the mounting surface; a metal plate bonded to the rear surface; and a side cover configured to surround the side surface, wherein the front cover extends to an area outside of the mounting surface in a first direction in which the mounting surface extends, and wherein the side cover is provided to extend, in a second direction in which the mounting surface faces, from an upper side of the metal plate to a lower end of a region of the front cover to seal the side surface from an outside.

20 Claims, 18 Drawing Sheets

(58) Field of Classification Search
CPC ............. H01L 33/44; H01L 2933/0091; H01L 27/1214; G09F 9/302; G09F 9/3023; G09G 2300/0426; G09G 5/18; G09G 3/32

See application file for complete search history.

(56) References Cited

U.S. PATENT DOCUMENTS

| | | | |
|---|---|---|---|
| 10,534,227 | B2 | 1/2020 | Kewon et al. |
| 2012/0140437 | A1* | 6/2012 | Kim ..................... F21V 29/87 362/249.02 |
| 2014/0062289 | A1 | 3/2014 | Kiryuschev et al. |
| 2018/0188579 | A1 | 7/2018 | Jeong et al. |
| 2019/0371232 | A1 | 12/2019 | Kim et al. |
| 2020/0113078 | A1 | 4/2020 | Kim et al. |
| 2020/0161405 | A1 | 5/2020 | Kim et al. |
| 2020/0388636 | A1 | 12/2020 | Yueh et al. |

FOREIGN PATENT DOCUMENTS

| | | |
|---|---|---|
| KR | 10-2018-0121293 A | 11/2018 |
| KR | 10-2020-0002733 A | 1/2020 |
| KR | 10-2020-0029191 A | 3/2020 |
| KR | 10-2020-0114646 A | 10/2020 |
| KR | 10-2354928 B1 | 1/2022 |
| KR | 10-2369969 B1 | 3/2022 |

OTHER PUBLICATIONS

European Extended Search Report issued Feb. 26, 2024 by the European Patent Office for EP Patent Application No. 21911460.0.

* cited by examiner

United States Patent US 12,046,589 B2

DISPLAY APPARATUS HAVING DISPLAY MODULE AND METHOD OF MANUFACTURING THE SAME

CROSS-REFERENCE TO THE RELATED APPLICATION

This application is a continuation of International Application No. PCT/KR2021/019457, filed Dec. 21, 2021, which claims priority from Korean Patent Application No. 10-2020-0182627, filed on Dec. 23, 2020, in the Korean Intellectual Property Office, the disclosures of which are incorporated herein in their entirety by reference.

TECHNICAL FIELD

Embodiments of the disclosure relate to a display apparatus for displaying an image by coupling modules each having self-emissive inorganic light emitting diodes (LEDs) mounted on a substrate.

BACKGROUND ART

A display apparatus is a type of an output device that visually displays data information, such as characters and figures, images, and the like.

In general, for a display apparatus, a liquid crystal panel requiring a backlight, or an organic LED (OLED) panel formed of an organic compound film that emits light by itself in response to an electric current, have been mainly used. However, the liquid crystal panel has a slow response time and large power consumption, and requires a backlight due to limitation on emitting light by itself, thereby making it difficult to provide the display apparatus in a compact size. In contrast, the OLED panel does not require a backlight due to emitting light by itself, and thus achieves slim thickness, but the OLED panel is susceptible to a burn-in phenomenon in which when the same screen is displayed for a long time, a part of the screen remains even when the screen is switched due to the life of sub-pixels being ended.

Accordingly, in order to find a replacement for the LCD panel and the OLED panel, research has been conducted on a micro light emitting diode (micro LED or μLED) that mounts an inorganic LED on a substrate and uses the inorganic LED itself as a pixel.

A micro LED display panel (hereinafter referred to as a micro LED panel) is one of the flat panel display panels and is composed of a plurality of inorganic LEDs each having a size less than or equal to 100 micrometers.

Such an LED panel is a self-emissive device, but as an inorganic light-emitting diode, is not susceptible to OLED burn-in, and has excellent brightness, resolution, power consumption, and durability.

Compared to the LCD panels that require a backlight, micro LED display panels offer better contrast, response time, and energy efficiency. Both the OLED and the micro LED are an inorganic LED have excellent energy efficiency, but the micro LED has superior brightness, luminous efficiency, and longer lifespan than the OLED.

In addition, the micro-LEDs may achieve a substrate-level display modulation by arranging LEDs on a circuit board in units of pixels, and provide various resolutions and screen sizes of display according to the customer's order.

SUMMARY

Technical Problem

Embodiments of the disclosure are directed to providing a display apparatus and a method of manufacturing the same, and specifically, a technical feature for protection against static electricity in a display module suitable for a large sized display, and a display apparatus having the same.

Technical Solution

According to embodiments, a display module is provided. The display module includes: a substrate comprising a mounting surface on which a plurality of inorganic light emitting diodes (LEDs) are mounted, a side surface, and a rear surface disposed opposite to the mounting surface; a front cover bonded to and covering the mounting surface; a metal plate bonded to the rear surface; and a side cover configured to surround the side surface, wherein the front cover extends to an area outside of the mounting surface in a first direction in which the mounting surface extends, and wherein the side cover is provided to extend, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

According to one or more embodiments, the display module further includes a side end member disposed on an outer end of the side cover in the first direction in which the mounting surface extends, and the side end member comprises a material having a conductivity higher than a conductivity of the side cover.

According to one or more embodiments, one end of the side end member, in the second direction, in which the mounting surface faces is in contact with the metal plate.

According to one or more embodiments, another end of the side end member, in the second direction, in which the mounting surface faces is in contact with the front cover.

According to one or more embodiments, the one end of the side end member is in contact with a side end of the metal plate.

According to one or more embodiments, the one end of the side end member is in contact with the side end of the metal plate in the first direction in which the mounting surface extends, and the other end of the side end member is in in contact with a side end of the front cover in the first direction in which the mounting surface extends.

According to one or more embodiments, the side cover comprises a non-conductive material.

According to one or more embodiments, the side cover comprises a light absorbing material.

According to one or more embodiments, the side surface is provided to correspond to four edges of the mounting surface, the front cover is provided to extend to an area outside of the four edges of the mounting surface in directions in which the mounting surface extends, and the side cover surrounds, outside of the mounting surface in the directions, the side surface and the lower end of the region of the front cover.

According to one or more embodiments, the side cover extends from the four edges of the mounting surface to four edges of the metal plate, corresponding to the four edges of the mounting surface, such that the side cover surrounds all of the four edges of the metal plate.

According to one or more embodiments, the display module further includes a driving circuit board arranged on the metal plate and configured to electrically control the plurality of inorganic LEDs, wherein the substrate further includes: chamfered portions formed between the mounting surface and the side surface and between the rear surface and the side surface, respectively, and a side surface wiring extending along the side surface and the chamfered portions and configured to electrically connect the plurality of inorganic LEDs to the driving circuit board, and the side cover surrounds the side surface, the chamfered portions, and the side surface wiring.

According to one or more embodiments, the substrate further includes chamfered portions formed between the mounting surface and the side surface and between the rear surface and the side surface, respectively, and the side cover surrounds an entirety of the chamfered portions.

According to one or more embodiments, the front cover comprises a first region that is in the area outside the mounting surface in the first direction in which the mounting surface extends, and further comprises a second region disposed on the mounting surface, and the side cover is provided, below the front cover in the second direction, at a position corresponding to the first region and is not provided in the second region.

According to embodiments, a display apparatus is provided. The display apparatus includes: a display module array in which a plurality of display modules are horizontally arranged in an M×N matrix, wherein each of the plurality of display modules includes: a substrate comprising a mounting surface on which a plurality of inorganic light emitting diodes (LEDs) are mounted, a side surface, and a rear surface disposed opposite to the mounting surface; a front cover bonded to and covering the mounting surface; a metal plate bonded to the rear surface; and a side cover configured to surround the side surface, wherein the front cover extends to an area outside of the mounting surface in a first direction in which the mounting surface extends, and wherein the side cover is extends, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

According to one or more embodiments, each of the plurality of display modules further comprises a side end member disposed on an outer end of the side cover in the first direction in which the mounting surface extends, and the side end member comprises a material having a conductivity higher than a conductivity of the side cover.

According to embodiments, a method of manufacturing a display module is provided. The method includes: obtaining a substrate including a mounting surface on which a plurality of inorganic light emitting diodes (LEDs) are mounted, a side surface, and a rear surface disposed opposite to the mounting surface; bonding a front cover to the mounting surface such as to cover the mounting surface; dispensing a side cover to surround the side surface; and bonding a metal plate to the rear surface of the substrate, wherein the front cover extends to an area outside of the mounting surface in a first direction in which the mounting surface extends, and wherein the side cover extends, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

According to one or more embodiments, the method further includes disposing a side end member on an outer end of the side cover in the first direction in which the mounting surface extends, wherein the side end member includes a material having a conductivity higher than a conductivity of the side cover.

According to one or more embodiments, the method further includes simultaneously cutting the front cover and the side cover in the second direction, such that at least a part of the front cover and a part of the side cover of the display module remain outside of the mounting surface in the first direction in which the mounting surface extends.

According to one or more embodiments, one end of the side end member, in the second direction, in which the mounting surface faces is in contact with the metal plate.

According to one or more embodiments, another end of the side end member, in the second direction, in which the mounting surface faces is in contact with the front cover.

Advantageous Effects

As is apparent from the above, the plurality of display modules of the display apparatus according to an embodiment of the disclosure have a front side and a lateral side sealed by a front cover and a side cover, respectively, and a rear side sealed by a metal plate, so that electro-static discharge (ESD) withstand voltage can be improved during the manufacturing and transportation process of the display modules and after assembly of the display modules in the display apparatus.

DETAILED DESCRIPTION

The example embodiments set forth herein are not representative of the full technical spirit of the disclosure, so it should be understood that they may be replaced with various equivalents and modifications.

In the following description, it is to be understood that the singular forms "a," "an," and "the" include plural references unless the context clearly dictates otherwise. In order to make the description of the disclosure clear, unrelated parts are not shown and, the sizes of components are exaggerated for clarity.

It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

In addition, the meaning of "identical" in the specification may include things being similar in properties to each other or are similar within a certain range. In addition, the meaning "identical" refers to "substantially identical". It should be understood that the meaning of "substantially identical" refers to a value that falls within an error range in manufacturing or a value having a difference within a range that does not have significance with respect to a reference value.

Hereinafter, certain non-limiting example embodiments will be described in detail with reference to the accompanying drawings.

Figure 1:
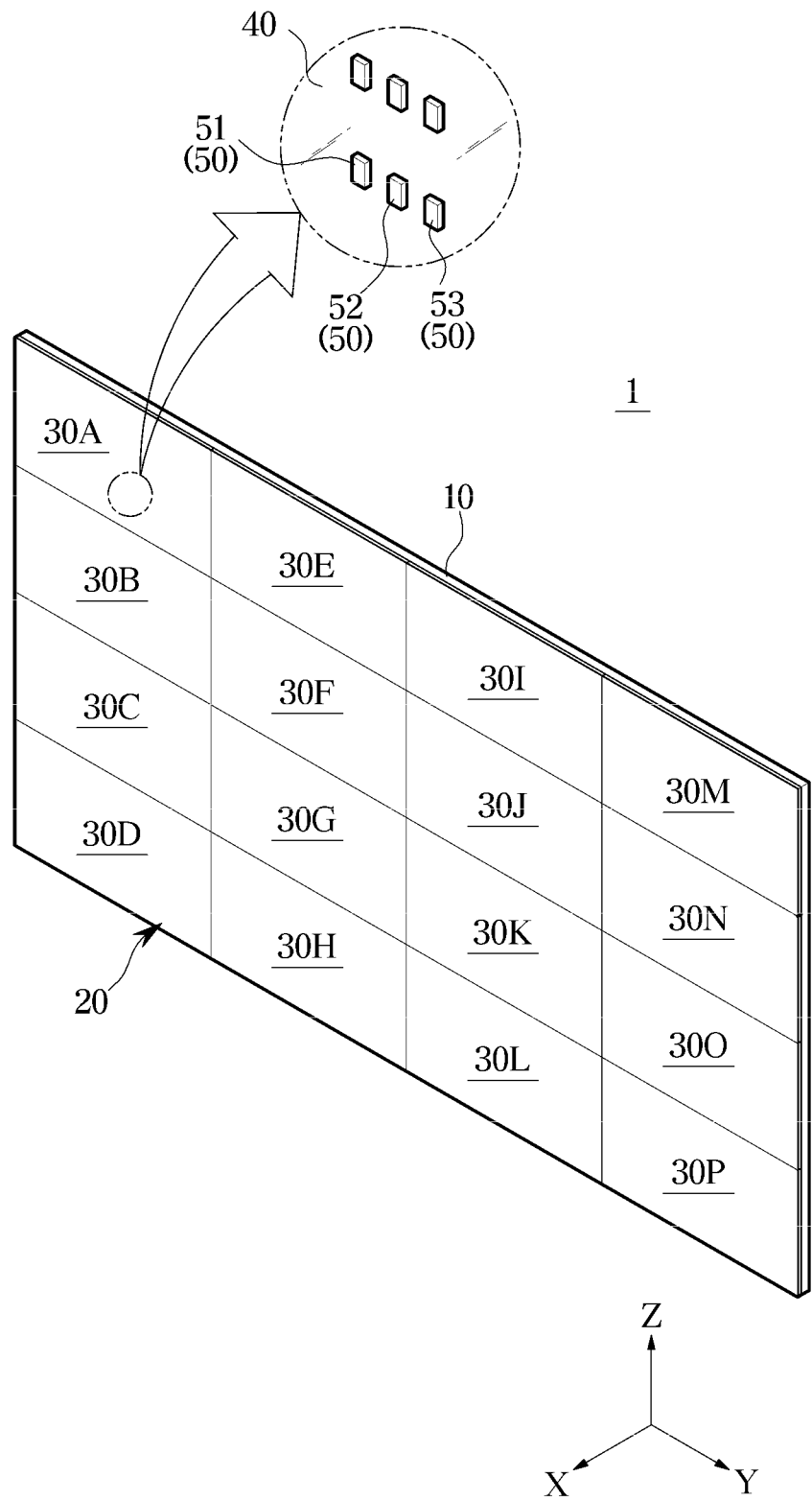
FIG. 1 is a view illustrating a display apparatus according to an embodiment.
Figure 2:
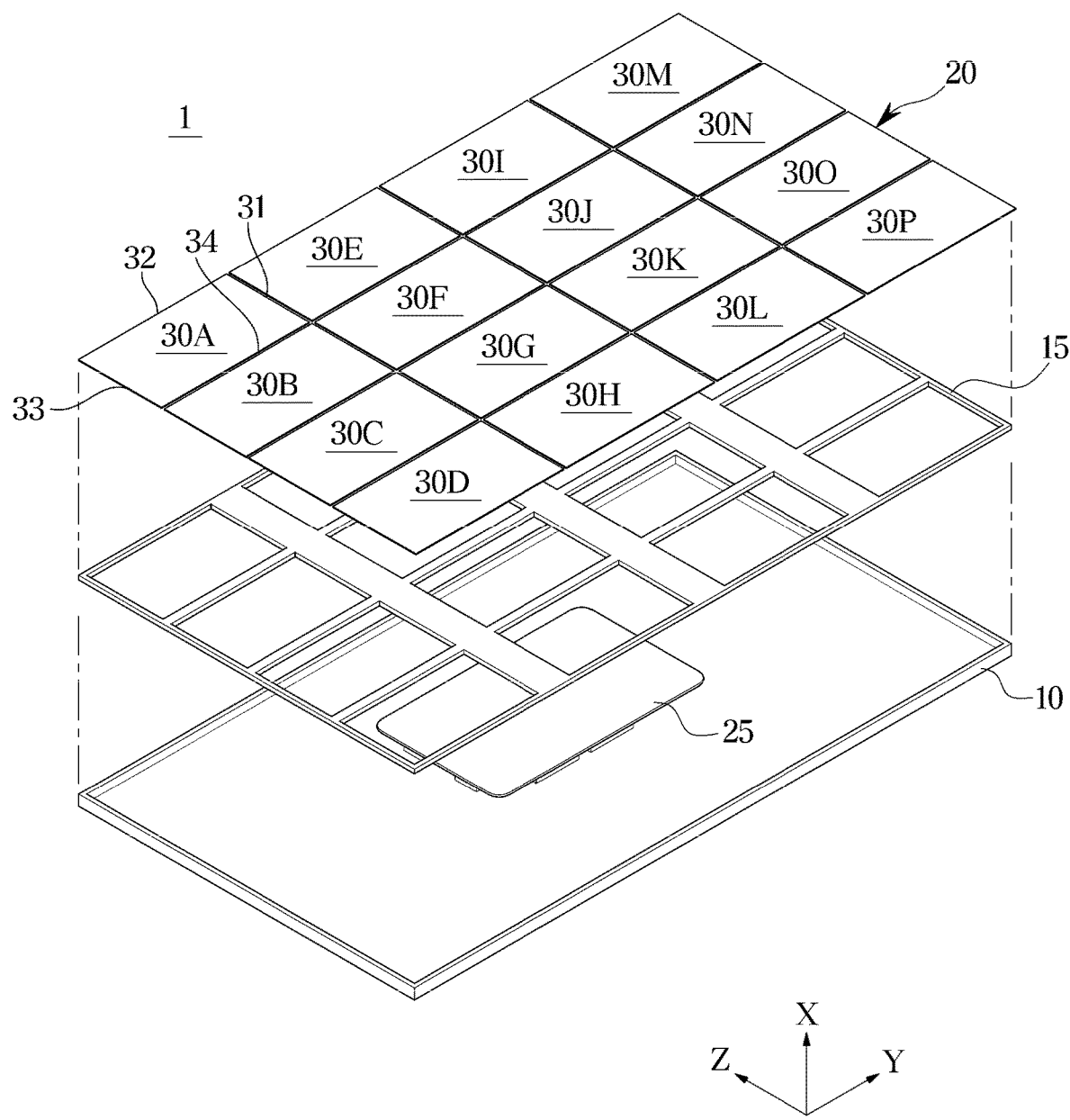
FIG. 2 is an exploded view illustrating main components of the display apparatus shown in FIG. 1.
Figure 3:
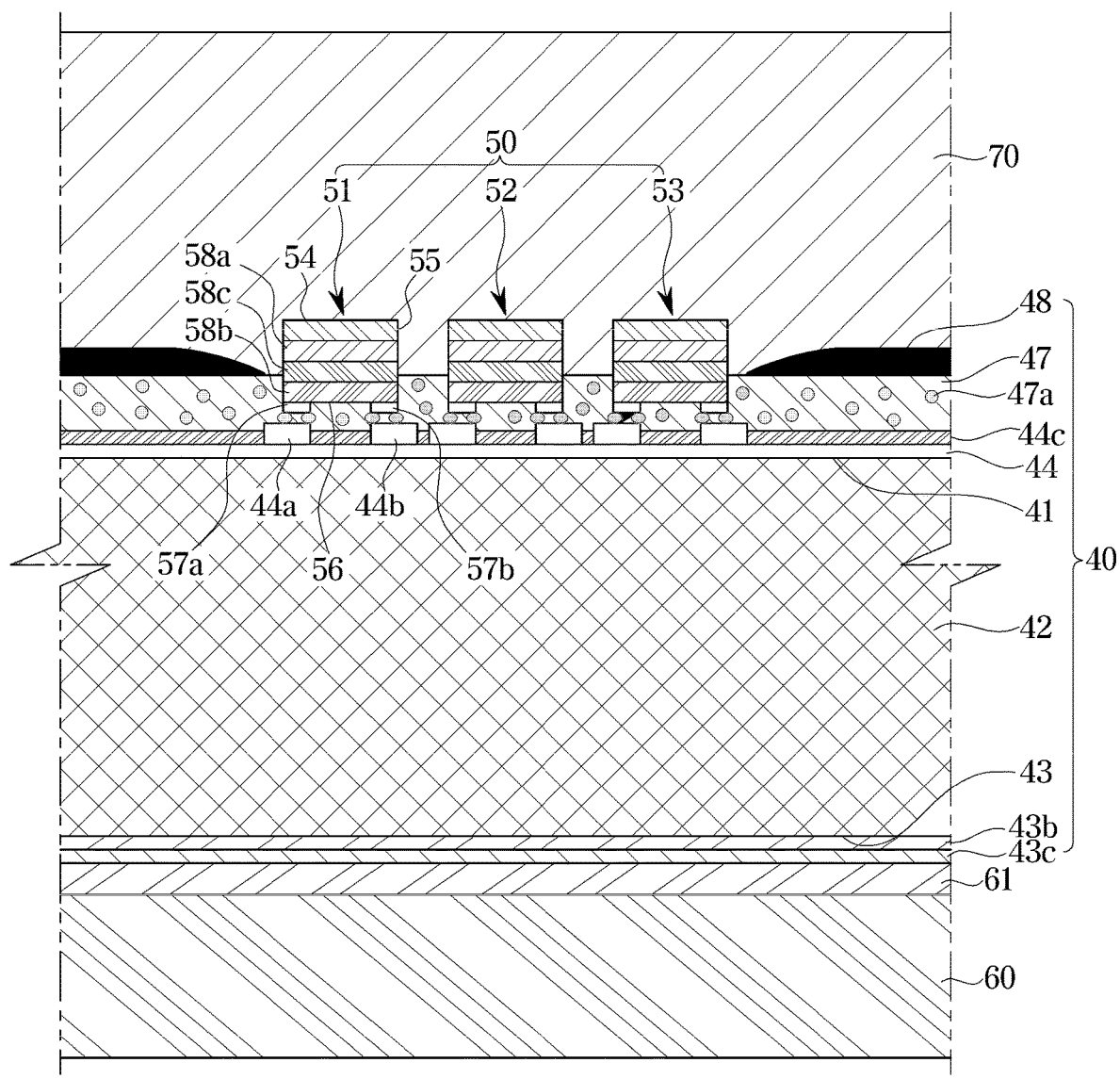
FIG. 3 is an enlarged view illustrating some components of the display module shown in FIG. 1.
Figure 4:
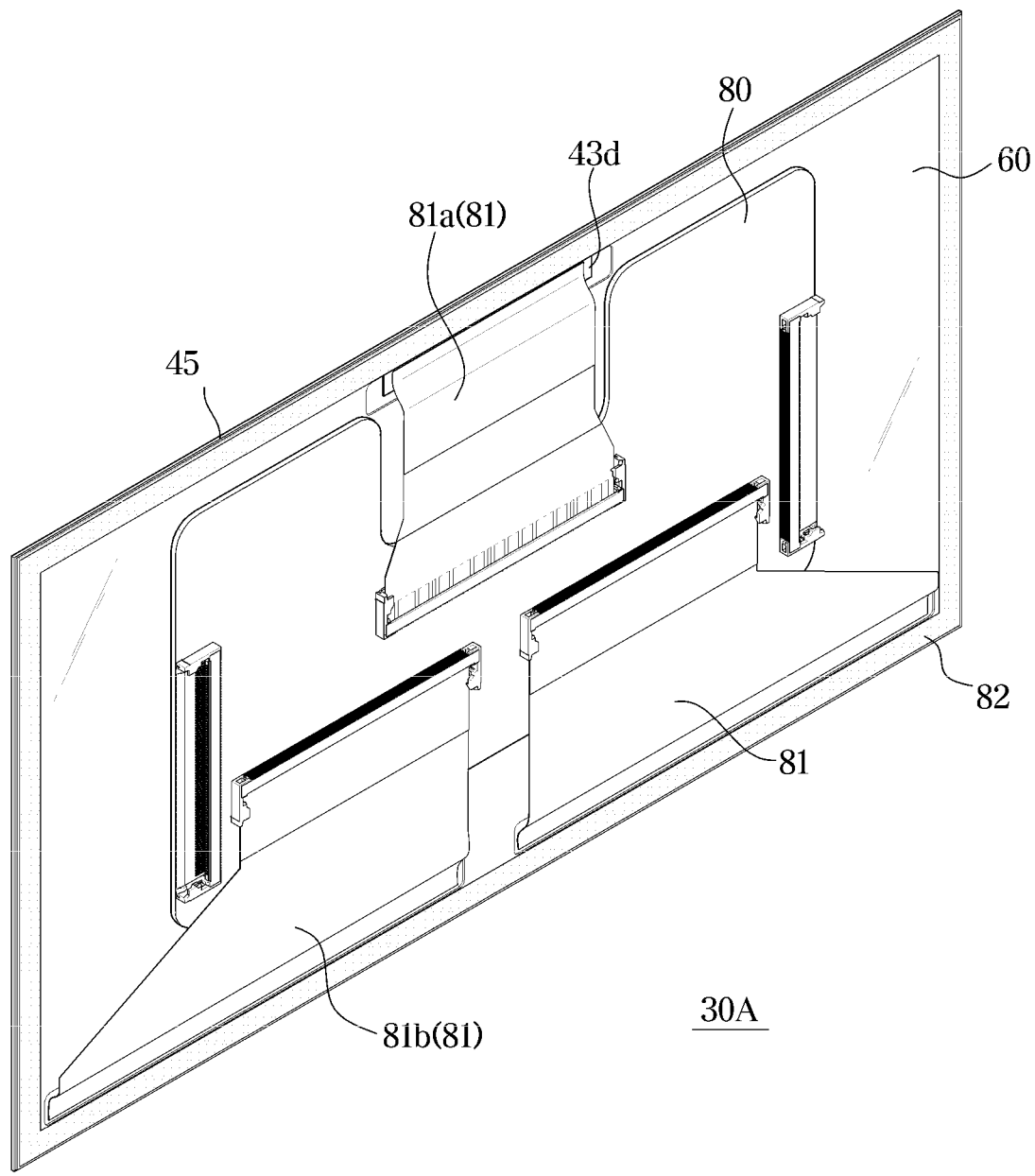
FIG. 4 is a rear perspective view illustrating the display module of the display apparatus shown in FIG. 1.
Figure 5:
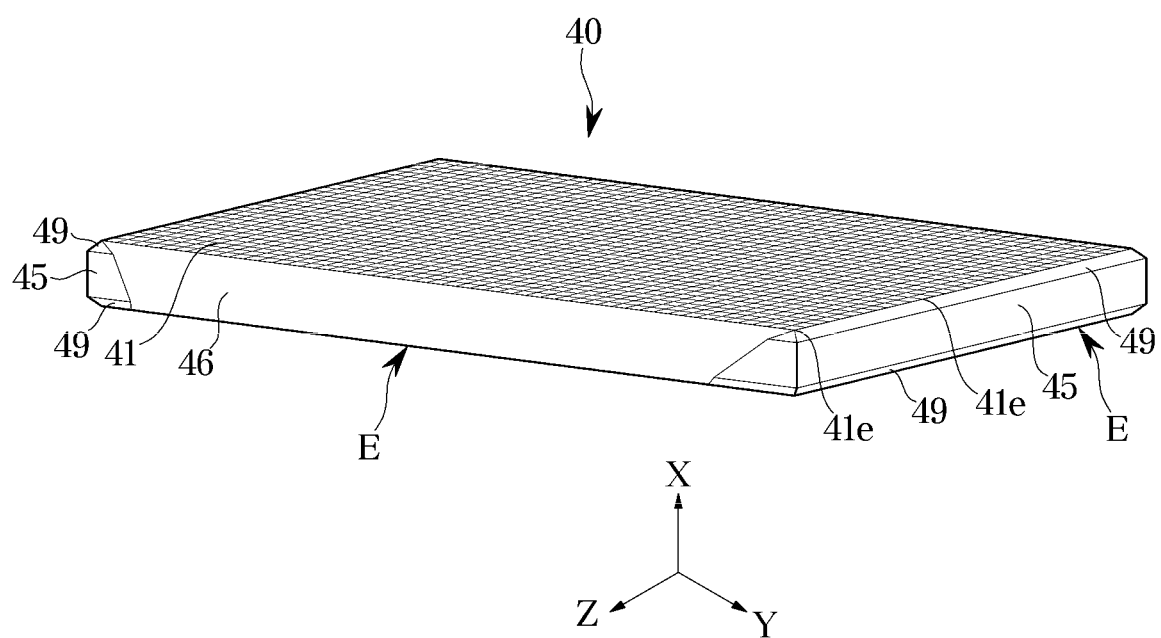
FIG. 5 is a perspective view illustrating some components of the display module shown in FIG. 1.

FIG. 1 is a view illustrating a display apparatus according to an embodiment, FIG. 2 is an exploded view illustrating main components of the display apparatus shown in FIG. 1, FIG. 3 is a view illustrating a substrate of the display module shown in FIG. 1, FIG. 4 is an enlarged cross-sectional view illustrating some components shown in FIG. 1, and FIG. 5 is a cross-sectional view illustrating some components of the display apparatus shown in FIG. 1, which is taken along a second direction.

In the following description, components of a display apparatus 1 including a plurality of inorganic LEDs 50 shown in the drawings are components in micro-units having a size of several μm to several hundreds of and the sizes of some components (a plurality of inorganic LEDs 50, a black matrix 48, etc.) shown in the drawings may be exaggerated for the sake of convenience of description.

The display apparatus 1 is a device that displays information, material, data, etc. as characters, figures, graphs, images, etc., and may be implemented as a television (TV), a personal computer (PC), a mobile, a digital signage, etc.

According to an embodiment, referring to FIGS. 1 and 2, the display apparatus 1 includes a display panel 20 configured to display an image, a power supply device configured to supply power to the display panel 20, a main board 25 configured to control the overall operation of the display panel 20, a frame 15 supporting the display panel 20, and a rear cover 10 covering a rear surface of the frame 15.

The display panel 20 may include a plurality of display modules 30A, 30B, 30C, 30D, 30E, 30F, 30G, 30H, 30I, 30J, 30K, 30L, 30M, 30N, 30O, and 30P, a driving board for driving each of the display modules 30A to 30P, and a Timing Controller (TCON) board generating a timing signal required for controlling each of the display modules 30A to 30P.

The rear cover 10 may support the display panel 20. The rear cover 10 may be installed on the floor through a stand, or may be installed on a wall through a hanger.

The plurality of display modules 30A to 30P may be arranged in upper to lower direction and left to right direction so as to be adjacent to each other. The plurality of display modules 30A to 30P may be arranged in an M×N matrix form, where M and N are natural numbers. In an embodiment, the display modules 30A to 30P are provided as sixteen display modules 30A to 30P and are arranged in a 4×4 matrix form, but there is no limitation on the number and arrangement method of a plurality of display modules.

The plurality of display modules 30A to 30P may be installed on the frame 15. The plurality of display modules 30A to 30P may be installed on the frame 15 through various methods, such as magnetic force using a magnet or a mechanical fitting structure. The rear cover 10 is coupled to the rear of the frame 15, and the rear cover 10 may form the rear appearance of the display apparatus 1.

The rear cover 10 may include a metal material. Accordingly, heat generated from the plurality of display modules 30A to 30P and the frame 15 is easily conducted to the rear cover 10 so that the heat dissipation efficiency of the display apparatus 1 may be increased.

As described above, the display apparatus 1 according to an embodiment may implement a large screen by tiling the plurality of display modules 30A to 30P.

In other embodiments of the disclosure, the plurality of display modules 30A to 30P may be individually applied to a display apparatus. That is, the display modules 30A to 30P may be singly installed and applied to a wearable device, a portable device, a handheld device, and other various types of electronic products or electric and installed parts that require display, or may be applied to a display apparatus, such as a monitor for a personal computer (PC), a high-resolution television (TV) and signage, and an electronic display, in a matrix form through assembly.

The plurality of display modules 30A to 30P may have the same configuration. Therefore, the description of any one display module described below may be equally applicable to all other display modules.

Since the plurality of display modules 30A to 30P have the same configuration, the plurality of display modules 30A to 30P will be described in relation to the display module 30A (hereinafter "first display module 30A").

That is, in order to avoid redundant descriptions, the configuration of the plurality of display modules 30A to 30P will be described in relation to the display module 30, the substrate 40, and the front cover 70 as an example.

In addition, the first display module 30A, the display module 30E (hereinafter "second display module 30E") disposed adjacent to the first display module 30A in the second direction Y, and the display module 30B (hereinafter "third display module 30E") disposed adjacent to the first display module 30A in the third direction Z among the plurality of display modules 30A to 30P will be described.

One of the plurality of display modules 30A to 30P, for example, the first display module 30A may be formed in a quadrangle shape. Alternatively, the first display module 30A may be provided in a rectangular shape or a square shape.

Accordingly, the first display module 30A may include an upper edge 32 and a lower edge 34 formed in the upper and lower sides and a left edge 33 and a right edge 31 formed in the left and right sides with respect to a first direction X, which is the forward direction.

Referring to FIG. 3, each of the plurality of display modules 30A to 30P may include a substrate 40 and a plurality of inorganic LEDs 50 mounted on the substrate 40. The plurality of inorganic LEDs 50 may be mounted on a mounting surface 41 of the substrate 40 facing in the first direction X. In FIG. 3, the thickness of the substrate 40 in the first direction X is shown to be exaggeratedly thick for the sake of convenience of description.

The substrate 40 may be formed in a quadrangle shape. As described above, the plurality of display modules 30A to 30P may be formed in a quadrangle shape, and the substrate 40 may be formed in a quadrangle shape to correspond to each display module.

The substrate 40 may be provided in a rectangular shape or a square shape.

Therefore, taking the first display module 30A as an example, the substrate 40 may include four edges E (see FIG. 5) corresponding to the right edge 31, the upper edge 32, the left edge 33, and the lower edge 34 of the first display module 30A (see FIG. 2).

The substrate 40 may include a substrate body 42, the mounting surface 41 forming one surface of the substrate body 42, a rear surface 43 forming another surface of the substrate body 42 and disposed opposite to the mounting surface 41, and a side surface 45 (see FIG. 5) disposed between the mounting surface 41 and the rear surface 43.

The substrate 40 may include a plurality of the chamfered portion 49 (see FIG. 5) formed between the mounting surface 41 and the side surface 45 and between the rear surface 43 and the side surface 45.

The plurality of the chamfered portion 49 may prevent the respective substrates from being collided and damaged when the plurality of display modules 30A to 30P are arranged.

The edges E of the substrate 40 is a concept including the side surface 45 and the chamfered portion 49.

The substrate 40 include a thin film transistor (TFT) layer 44 formed on the substrate body 42 to drive the inorganic LEDs 50. The substrate body 42 may include a glass substrate. That is, the substrate 40 may include a chip on glass (COG) type substrate. The substrate 40 may include a first pad electrode 44a and a second pad electrode 44b provided to electrically connect the inorganic LEDs 50 to the TFT layer 44.

A thin film transistor (TFT) forming the TFT layer 44 is not limited to a specific structure or type, and may be configured in various embodiments. That is, the TFT of the TFT layer 44 according to an embodiment of the disclosure may be implemented using a Low Temperature Poly Silicon (LTPS) TFT, an oxide TFT, a Si (poly silicon, or a-silicon) TFT, but also using an organic TFT, a graphene TFT, and the like.

In addition, when the substrate body 42 of the substrate 40 is formed of a silicon wafer, the TFT layer 44 may be replaced with a Complementary Metal-Oxide Semiconductor (CMOS) type transistor or an n-type MOSFET or p-type MOSFET transistor.

The plurality of inorganic LEDs 50 may include inorganic LEDs formed of an inorganic material and having a width, a length, and a height, each of several μm to several tens of μm.

In one example of embodiments of the disclosure, the plurality of inorganic LEDs 50 may be provided with the micro inorganic LEDs. Each of the micro-inorganic LEDs may have a short side of 100 μm or less among the width, the length, and the height. That is, each of the inorganic LEDs 50 may be picked up from a sapphire or silicon wafer and transferred directly onto the substrate 40. The plurality of inorganic LEDs 50 may be picked up and transported through an electrostatic method using an electrostatic head or a stamp method using an elastic polymer material, such as polydimethylsiloxane (PDMS) or silicon, as a head.

The plurality of inorganic LEDs 50 is a light emitting structure including an n-type semiconductor 58a, an active layer 58c, a p-type semiconductor 58b, a first contact electrode 57a, and a second contact electrode 57b.

Although not shown in the drawing, one of the first contact electrode 57a and the second contact electrode 57b is electrically connected to the n-type semiconductor 58a, and the other is provided to be electrically connected to the p-type semiconductor 58b.

The first contact electrode 57a and the second contact electrode 57b may be in the form of a flip chip so as to be disposed in parallel with each other while facing in the same direction (a direction opposite to the light emission direction).

Each of the inorganic LEDs 50 may include a light emitting surface 54 disposed to face in the first direction X when mounted on the mounting surface 41, a side surface 55, and a bottom surface 56 disposed at a side opposite to the light emitting surface 54, and the first contact electrode 57a and the second contact electrode 57b may be formed on the bottom surface 56.

That is, the first contact electrode 57a and the second contact electrode 57b of the inorganic LEDs 50 may be disposed on a side opposite to the light emitting surface 54 so as to be disposed at a side opposite and facing away from the light emission direction.

The first contact electrode 57a and the second contact electrode 57b may be disposed to face the mounting surface 41, may be electrically connected to the TFT layer 44, and the light emitting surface 54 may be arranged to emit light in a direction opposite and facing away from the first contact electrode 57a and the second contact electrode 57b.

Therefore, when light generated from the active layer 58c is emitted in the first direction X through the light emitting surface 54, the light may be emitted in the first direction X without interfering with the first contact electrode 57a or the second contact electrode 57b.

That is, the first direction X may be defined as a direction in which light is emitted from the light emitting surface 54.

The first contact electrode 57a and the second contact electrode 57b may be electrically connected to the first pad electrode 44a and the second pad electrode 44b formed at a side of the mounting surface 41 of the substrate 40, respectively.

Each of plurality of inorganic LEDs 50 may be directly connected to a respective one of the first pad electrode 44a and the second pad electrode 44b through a bonding configuration, such as an anisotropic conductive layer 47 or solder.

The anisotropic conductive layer 47 may be formed on the substrate 40 to mediate electrical bonding between the first contact electrode 57a and the first pad electrode 44a, and between the second contact electrode 57b and the second pad electrode 44b. The anisotropic conductive layer 47 may represent an anisotropic conductive adhesive attached on a protective film, and have a structure in which conductive balls 47a are scattered in an adhesive resin. The conductive balls 47a may be conductive spheres surrounded by a thin insulating film, and when the insulating film is broken by a pressure, electrical connection occurs between conductors.

The anisotropic conductive layer 47 may include an anisotropic conductive film (ACF) in the form of a film and an anisotropic conductive paste (ACP) in the form of a paste.

Therefore, when the plurality of inorganic LEDs 50 are mounted on the substrate 40, a pressure applied to the anisotropic conductive layer 47 causes the insulating film of the conductive balls 47a to be broken, so that the first contact electrode 57a and the second contact electrode 57b of the inorganic LEDs 50 may be electrically connected to the first pad electrode 44a and the second pad electrode 44b of the substrate 40.

Although not shown in the drawing, the plurality of inorganic LEDs 50 may be mounted on the substrate 40 through a solder instead of the anisotropic conductive layer 47. The inorganic LEDs 50 may be aligned on the substrate 40 first, and then the inorganic LEDs 50 may be subject to a reflow process to be bonded to the substrate 40.

The plurality of inorganic LEDs 50 may include a red LED 51, a green LED 52, and a blue LED 53, and the inorganic LEDs 50 may be mounted on the mounting surface 41 of the substrate 40 in a series of a plurality of the red LED 51, a plurality of the green LED 52, and a plurality of the blue LED 53 as one unit. A series of the plurality of the red LED 51, the plurality of the green LED 52, and the plurality of the blue LED 53 may form one pixel. In this case, the red LED 51, the green LED 52, and the blue LED 53 may each form a sub-pixel.

The red LED 51, the green LED 52, and the blue LED 53 may be arranged in a line at predetermined intervals as in an embodiment, or may be arranged in a different shape, such as a triangular shape.

The substrate 40 may include a light absorbing layer 44c to improve the contrast by absorbing external light. The light absorbing layer 44c may be formed on a side of the mounting surface 41 of the substrate 40 as a whole. The light absorbing layer 44c may be formed between the TFT layer 44 and the anisotropic conductive layer 47.

The plurality of display modules 30A to 30P may further include a black matrix 48 formed between the plurality of inorganic LEDs 50.

The black matrix 48 may perform a function of supplementing the light absorbing layer 44c entirely formed at a side of the mounting surface 41 of the substrate 40. That is, the black matrix 48 absorbs external light and allows the substrate 40 to appear black, thereby improving the contrast of the screen.

The black matrix 48 may have a black color.

In an embodiment, the black matrix 48 is formed to be disposed between pixels each formed by a series of the plurality of the red LED 51, the plurality of the green LEs 52, and the plurality of the blue LED 53. In an embodiment, the black matrix 48 may be formed at a higher precision and partition each of the red LED 51, the green LED 52, and blue LED 53, which are sub-pixels.

The black matrix 48 may be formed in a grid shape having a horizontal pattern and a vertical pattern so as to be disposed between pixels.

The black matrix 48 may be formed by applying a light-absorbing ink on the anisotropic conductive layer 47 through an ink-jet process and curing the light-absorbing ink, or by coating a light-absorbing film on the anisotropic conductive layer 47.

That is, on the anisotropic conductive layer 47 formed entirely on the mounting surface 41, the black matrix 48 may be formed in gaps between the plurality of inorganic LEDs 50 in which the plurality of inorganic LEDs 50 are not mounted.

The plurality of display modules 30A to 30P may each include a front cover 70 disposed on the mounting surface 41 in the first direction X, respectively, to cover the mounting surface 41 of the respective one of the plurality of display modules 30A to 30P.

Figure 6:
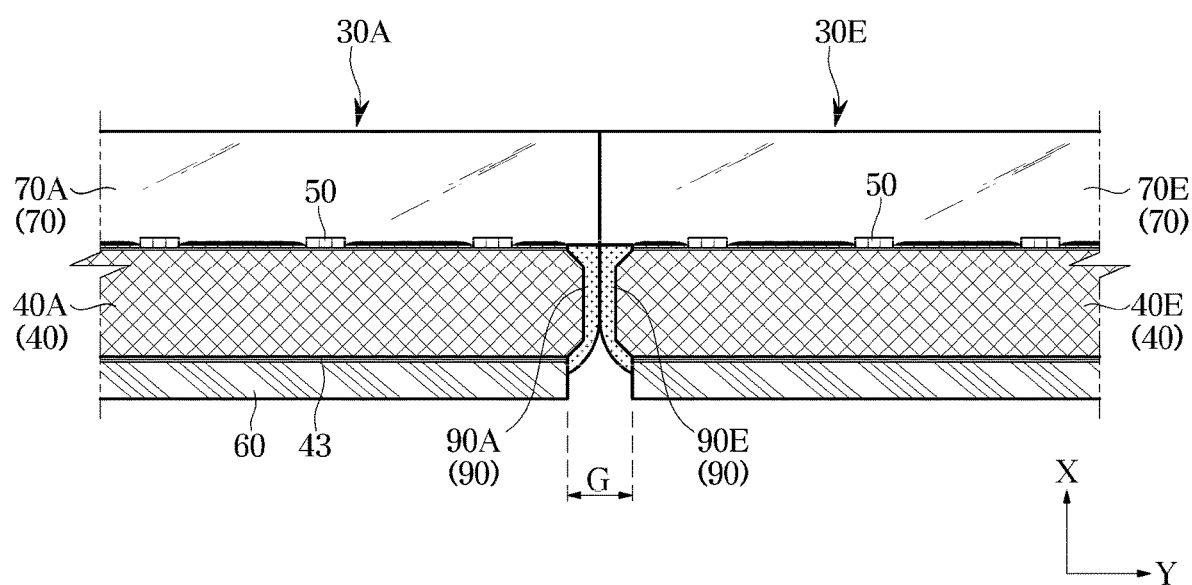
FIG. 6 is a cross-sectional view illustrating some components of the display apparatus shown in FIG. 1, which is taken along a second direction.
Figure 7:
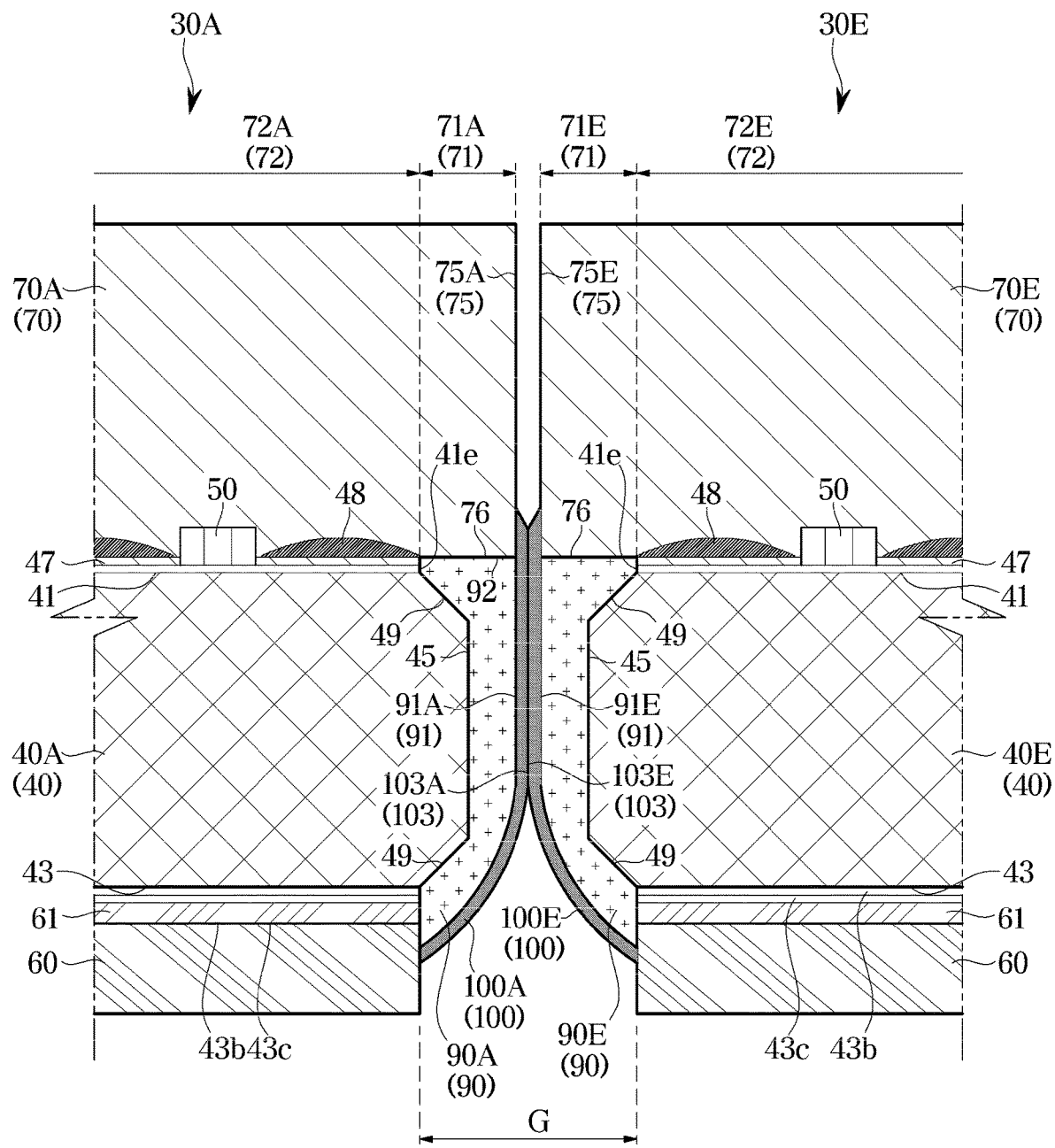
FIG. 7 is a cross-sectional view illustrating some components of the display apparatus shown in FIG. 1, which is taken along a third direction.

The front cover 70 may be provided in plural so that the plurality of the front cover 70 is formed on the plurality of display modules 30A to 30P in the first direction X, respectively (see FIGS. 6 and 7)

Each of the plurality of display modules 30A to 30P may be assembled to each other after each front cover 70 thereof is formed. That is, among the plurality of display modules 30A to 30P, as for a first display module 30A and a second display module 30E, a first front cover 70A may be formed on the mounting surface 41 of the first display module 30A, and a second front cover 70E may be formed on the mounting surface 41 of the second display module 30E.

The front cover 70 may be provided to cover the substrate 40 to protect the substrate 40 from external force or external moisture.

The front cover 70 may include a plurality of layers (not shown). The front cover 70 may include an adhesive layer (not shown) provided so that the front cover 70 is bonded to the mounting surface 41 of the substrate 40.

The plurality of layers (not shown) of the front cover 70 may be provided as functional films having optical performance. This will be described below in detail.

Each front cover 70 may be formed of an optical clear resin (OCR). In particular, the adhesive layer (not shown) may be formed of an OCR. The OCR may be in a highly transparent state having a transmittance of 90% or more.

The OCR may improve visibility and image quality through low-reflection properties. That is, in a structure having an air gap, light loss occurs due to a difference in refractive index between a film layer and an air layer, but in a structure using an OCR, the difference in refractive index decreases, thereby reducing light loss and consequently improving visibility and image quality.

That is, the OCR may improve the image quality while protecting the substrate 40.

In general, the front cover 70 may be provided to have a height greater than or equal to a predetermined height in the first direction X in which the mounting surface 41 or the light emitting surface 54 faces.

Accordingly, when the front cover 70 is formed on the substrate 40, a gap that may be formed between the front cover 70 and the plurality of inorganic LEDs 50 is sufficiently filled.

In addition, each of the plurality of display modules 30A to 30P may include an adhesive layer 61 disposed between the rear surface 43 and a metal plate 60 to bond the rear surface 43 of the substrate 40 and the metal plate 60 to each other.

The plurality of inorganic LEDs 50 may be electrically connected to a pixel driving wiring (not shown) formed on the mounting surface 41 and an upper surface wiring layer (not shown) extending through the side surface 45 of the substrate 40 and formed of the pixel driving wiring (not shown).

The upper surface wiring layer (not shown) may be formed under the anisotropic conductive layer 47. The upper surface wiring layer (not shown) may be electrically connected to a side surface wiring 46 formed on the side surface 45 of the substrate 40. The side surface wiring 46 may be provided in the form of a thin film as shown in FIG. 4.

With respect to the first direction X facing in the forward direction of the display apparatus 1, when a direction perpendicular to the first direction X and facing in a left-right direction of the display apparatus 1 is assumed as a second direction Y, and a direction perpendicular to the first direction X and the second direction Y and facing in a upper-lower direction of the display apparatus 1 is assumed as a third direction Z, the side surface wiring 46 may extend along the chamfered portion 49 and the side surface 45 of the substrate 40 in the third direction Z to the rear surface 43 of the substrate 40.

However, embodiments of the disclosure are not limited thereto, and the side surface wiring 46 may extend along the chamfered portion 49 and the side surface 45 of the substrate 40 in the second direction Y to the rear surface 43 of the substrate 40.

According to the embodiment, the side surface wiring 46 may be provided to extend along a side of an edge E of the substrate 40 corresponding to the upper edge 32 and the lower edge 34 of the first display module 30A.

However, embodiments of the disclosure are not limited thereto, and the side surface wiring 46 may extend along the edge E of the substrate 40 corresponding to at least two of the right edge 31, the upper edge 32, the left edge 33, and the lower edge 34 of the first display module 30A.

The upper surface wiring layer (not shown) may be connected to the side surface wiring 46 by an upper surface connection pad (not shown) formed on a side of an edge E of the substrate 40.

The side surface wiring 46 may extend along the side surface 45 of the substrate 40 and may be connected to a rear surface wiring layer 43b formed on the rear surface 43.

An insulating layer 43c covering the rear surface wiring layer 43b may be formed on the rear surface wiring layer 43b in a direction in which the rear surface 43 of the substrate 40 faces.

That is, the plurality of inorganic LEDs 50 may be sequentially electrically connected to the upper surface wiring layer (not shown), the side surface wiring 46, and the rear surface wiring layer 43b.

In addition, as shown in FIG. 4, the first display module 30A may include a driving circuit board 80 provided to electrically control the plurality of inorganic LEDs 50 mounted on the mounting surface 41. The driving circuit board 80 may be formed as a printed circuit board. The driving circuit board 80 may be disposed on the rear surface 43 of the substrate 40 in the first direction X. Although to be described in detail below, the driving circuit board 80 may be disposed on the metal plate 60 bonded to the rear surface 43 of the substrate 40.

The first display module 30A may include a flexible film 81 connecting the driving circuit board 80 to the rear surface wiring layer 43b such that the driving circuit board 80 is electrically connected to the plurality of inorganic LEDs 50.

In detail, the flexible film 81 may have one end disposed on the rear surface 43 of the substrate 40 and may be connected to a rear surface connection pad 43d electrically connected to the plurality of inorganic LEDs 50.

The rear surface connection pad 43d may be electrically connected to the rear surface wiring layer 43b. Accordingly, the rear surface connection pad 43d may electrically connect the rear surface wiring layer 43b to the flexible film 81.

As the flexible film 81 is electrically connected to the rear surface connection pad 43d, power and an electrical signal from the driving circuit board 80 may be transmitted to the plurality of inorganic LEDs 50.

The flexible film 81 may be formed of a flexible flat cable (FFC) or a chip on film (COF).

The flexible film 81 may include a first flexible film 81a and a second flexible film 81b that are arranged in the upper and lower directions, respectively, with respect to the first direction X, which is a forward direction.

The first flexible film 81a and the second flexible film 81b are not limited thereto, and may be arranged in the left and right directions with respect to the first direction X, or may be disposed in at least two directions among the upper, lower, left, and right directions.

The second flexible film 81b may be provided in a plurality of units thereof. However, embodiments of the disclosure are not limited thereto, and the second flexible film 81b may be provided in a single unit thereof, and the first flexible film 81a may be provided in a plurality of units thereof.

The first flexible film 81a may transmit a data signal from the driving circuit board 80 to the substrate 40. The first flexible film 81a may be provided using a COF.

The second flexible film 81b may transmit power from the driving circuit board 80 to the substrate 40. The second flexible film 81b may be provided using an FFC.

However, embodiments of the disclosure re not limited thereto, and the first flexible film 81a and the second flexible film 81b may be formed opposite to each other.

Although not shown in the drawings, the driving circuit board 80 may be electrically connected to the main board 25 (see FIG. 2). The main board 25 may be disposed on a rear side of the frame 15, and the main board 25 may be connected to the driving circuit board 80 through a cable (not shown) at the rear of the frame 15.

As described above, the metal plate 60 may be provided to be in contact with the substrate 40. The metal plate 60 and the substrate 40 may be bonded to each other by the adhesive layer 61 disposed between the rear surface 43 of the substrate 40 and the metal plate 60.

The metal plate 60 may be formed of a metal material having high thermal conductivity. For example, the metal plate 60 may be formed of an aluminum material.

Heat generated from the plurality of inorganic LEDs 50 mounted on the substrate 40 and the TFT layer 44 is transferred to the metal plate 60 through the adhesive layer 61 along the rear surface 43 of the substrate 40.

Accordingly, heat generated from the substrate 40 may be easily transferred to the metal plate 60 and the substrate 40 may be prevented from rising above a certain temperature.

The plurality of display modules 30A to 30P may be arranged in various positions in a matrix form of M*N. Each of the display modules 30A to 30P is provided to be individually movable. In this case, each of the display modules 30A to 30P individually includes the metal plate 60 so that a constant level of heat dissipation performance is maintained regardless of the position where the display modules 30A to 30P are disposed.

The plurality of display modules 30A to 30P may be arranged in a matrix form of various M*N to form various sized screens of the display apparatus 1. Accordingly, compared to using a single metal plate provided for heat dissipation, the display modules 30A to 30P, each including an independent one of the metal plate 60 as in the embodiment of the disclosure, may individually dissipate heat so that the heat dissipation efficiency of the display apparatus 1 is improved as a whole.

When only a single metal plate is disposed inside the display apparatus 1, a part of the metal plate may not be disposed at a position corresponding to a location where some display modules are disposed in the front-rear direction, and the metal plate may be disposed at a position corresponding to a location having no display module disposed, so that the heat dissipation efficiency of the display apparatus 1 may be reduced.

That is, because a respective one of the metal plate 60 is disposed on each of the display modules 30A to 30P, each of the display modules 30A to 30P may individually perform self-heat dissipation by the respective one of the metal plate 60 regardless of the position where each of the display modules 30A to 30P is disposed, so that the total heat dissipation performance of the display apparatus 1 may be improved.

The metal plate 60 may be provided in a rectangular shape that substantially corresponds to the shape of the substrate 40.

The area of the substrate 40 may be at least equal to or larger than the area of the metal plate 60. When the substrate 40 and the metal plate 60 are arranged in parallel to each other in the first direction X, four edges of the substrate 40 having a rectangular shape may be disposed to correspond to four edges of the metal plate 60 based on the centers of the substrate 40 and the metal plate 60, or may be disposed to correspond to an area outside the four edges of the metal plate 60 based on the centers of the substrate 40 and the metal plate 60.

According to embodiments, the four edges E of the substrate 40 may be disposed to correspond to an area outside the four edges of the metal plate 60. That is, the area of the substrate 40 may be provided to be larger than the area of the metal plate 60.

When heat is transferred to each of the display modules 30A to 30P, the substrate 40 and the metal plate 60 may thermally expand. The metal plate 60 has a coefficient of thermal expansion higher than that of the substrate 40, so the metal plate 60 may expand by a scale larger than a scale by which the substrate 40 expands.

In this case, the edge of the metal plate 60 may protrude to an area outside the substrate 40 when the four edges E of the substrate 40 are disposed to correspond to the four edges of the metal plate 60 or are disposed to correspond to an area inside the four edges of the metal plate 60.

Accordingly, the separation length of the gap formed between the respective display modules 30A to 30P may be irregular by the thermal expansion of the metal plate 60 of each of the display modules 30A to 30P, and thus the revelation of a seam may be increased, and the sense of unity of the screen of the display panel 20 may be lowered.

However, when the four edges E of the substrate 40 are provided to be disposed outside the four edges of the metal plate 60, even when the substrate 40 and the metal plate 60 are thermally expanded, the metal plate 60 does not protrude to an area outside the four edges E of the substrate 40, and thus the separation length of the gap formed between the respective display modules 30A to 30P may be kept constant.

In addition, in order to maintain a constant separation length of the gap between the respective display modules 30A to 30P, the frame 15 supporting each of the display modules 30A to 30P may include a front surface having a material property similar to that of the substrate 40. That is, each of the display modules 30A to 30P may be attached to the front surface of the frame 15.

According to the embodiment of the disclosure, the substrate 40 and the metal plate 60 may be provided to have areas approximately corresponding to each other. Accordingly, heat generated from the substrate 40 may be uniformly radiated over the entire area of the substrate 40 without being isolated to a partial area.

The metal plate 60 may be provided to be bonded to the rear surface 43 of the substrate 40 by the adhesive layer 61.

The adhesive layer 61 may have a size corresponding to that of the metal plate 60. That is, the area of the adhesive layer 61 may be provided to correspond to the area of the metal plate 60. The metal plate 60 may be provided in a substantially rectangular shape, and the adhesive layer 61 may be provided in a rectangular shape to correspond to that of the metal plate 60.

The edge of the metal plate 60 and the edge of the adhesive layer 61 may be formed to correspond to each other with respect to the centers of the metal plate 60 and the adhesive layer 61.

Accordingly, the metal plate 60 and the adhesive layer 61 may be easily manufactured in a single combined configuration, so that the manufacturing efficiency of the display apparatus 1 may be increased as a whole.

That is, when the metal plate 60 is cut in units of preset number from one plate, the adhesive layer 61 is bonded to the one plate in advance before the metal plate 60 is cut, and the adhesive layer 61 and the metal plate 60 may be simultaneously cut in units of preset number, so that the number of processes may be reduced.

Heat generated from the substrate 40 may be transferred to the metal plate 60 through the adhesive layer 61. As such, the adhesive layer 61 may be provided to bond the metal plate 60 to the substrate 40 while transferring heat generated from the substrate 40 to the metal plate 60.

Accordingly, the adhesive layer 61 may include a material having high heat dissipation performance.

Basically, the adhesive layer 61 may include a material having adhesive properties to bond the substrate 40 and the metal plate 60 to each other.

Additionally, the adhesive layer 61 may include a material having heat dissipation performance higher than that of a general material having an adhesiveness. Accordingly, heat may be efficiently transferred between the substrate 40 and the metal plate 60.

In addition, the adhesive material of the adhesive layer 61 may be formed of a material having a heat dissipation performance higher than that of an adhesive material forming a general adhesive.

A material with high heat dissipation performance refers to a material that may effectively transfer heat with high thermal conductivity, high heat transfer, and low specific heat.

For example, the adhesive layer 61 may include a graphite material. However, embodiments of the disclosure are not limited thereto, and the adhesive layer 61 may be formed of a material having high heat dissipation performance.

The adhesive layer 61 may be provided to have a ductility greater than ductility of the substrate 40 and the metal plate 60. Accordingly, the adhesive layer 61 may be formed of a material having high ductility while having adhesive properties and heat dissipation properties. The adhesive layer 61 may be formed of an inorganic double-sided tape. As described above, the adhesive layer 61 may be formed of an inorganic tape, so that the adhesive layer 61 may be provided as a single layer having one surface thereof bonded to the substrate 40 and the other surface thereof bonded to the metal plate 60 without a substrate supporting the one surface and the other surface.

The adhesive layer 61 does not include a substrate, and thus does not include a material that interferes with heat conduction, so that heat dissipation performance may be increased. However, the adhesive layer 61 is not limited to the inorganic double-sided tape, and may be provided using a heat dissipation tape having a superior heat dissipation performance than a general double-sided tape.

As described above, since the substrate 40 is formed of a glass material and the metal plate 60 is formed of a metal material, the material properties of each configuration are different, so the degrees to which the materials are deformed by the same heat may be different. That is, when heat is generated in the substrate 40, the substrate 40 and the metal plate 60 may be thermally expanded to different sizes. Accordingly, the first display module 30A may be damaged in comparative embodiments.

In a state in which the substrate 40 and the metal plate 60 are fixed to each other, the substrate 40 and the metal plate 60, which have different expansion values at the same temperature, are expanded to different sizes, so that a stress may be generated in each of the substrate 40 and the metal plate 60.

Among the material properties, in particular, the thermal expansion coefficients being different between the materials, cause the degrees to which the materials are physically deformed by heat to be different. In particular, since the thermal expansion coefficient of a metal material is generally larger than that of glass, when the substrate 40 and the metal plate 60 are subjected to the same heat, the metal plate 60 is expanded and deformed to a larger degree than the substrate 40 is expanded and deformed.

Conversely, even when heat generation in the substrate 40 is terminated and the substrate 40 and the metal plate 60 are cooled, the metal plate 60 may be contracted and deformed to a larger degree than the substrate 40 is contracted and deformed.

Since the substrate 40 and the metal plate 60 are bonded to each other by the adhesive layer 61, when the metal plate 60 is deformed to a larger degree than the substrate 40, an external force may be transmitted to the substrate 40.

Conversely, an external force may be transmitted also to the metal plate 60 by the substrate 40, but because the rigidity of the substrate 40 formed of glass is smaller than that of the metal plate 60 formed of metal, the substrate 40 may be damaged in comparative embodiments.

The adhesive layer 61 may be provided between the substrate 40 and the metal plate 60 to absorb external forces transmitted from the substrate 40 and the metal plate 60 that are expanded in different sizes.

Accordingly, the external forces are prevented from being transmitted to the substrate 40 and the metal plate 60, and in particular, the substrate 40 is prevented from being damaged.

The adhesive layer 61 may be formed of a material having high ductility to absorb external force transmitted from the substrate 40 and the metal plate 60. In detail, the ductility of the adhesive layer 61 may be greater than the ductility of the substrate 40 and the metal plate 60.

Accordingly, when an external force generated from the size change of the substrate 40 and the metal plate 60 is transferred to the adhesive layer 61, the adhesive layer 61 itself is deformed to prevent the external force from being transmitted to other components.

The adhesive layer 61 may have a predetermined thickness in the first direction X. When the metal plate 60 is subject to heat and thermally expanded or cooled and contracted, the metal plate 60 may be expanded or contracted in a direction orthogonal to the first direction X as well as the first direction X, and thus an external force may be transmitted to the substrate 40.

Even when the metal plate 60 expands or contracts in a direction orthogonal to the first direction X, the thickness of the adhesive layer 61 is changed so that the external force is prevented from being transmitted to the substrate 40. Additionally, the thermal expansion coefficient of the adhesive layer 61 may be different from the thermal expansion coefficient of the substrate 40 and the metal plate 60.

According to embodiments, the thermal expansion coefficient of the adhesive layer 61 may be greater than the thermal expansion coefficient of the substrate 40 and smaller than the thermal expansion coefficient of the metal plate 60.

Accordingly, at the same temperature, the adhesive layer 61 may not be deformed in the same manner as the substrate 40 or the metal plate 60, and the adhesive layer 61 between the substrate 40 and the metal plate 60 may buffer deformation of the substrate 40 and the metal plate 60.

As such, the adhesive layer 61 is disposed between the substrate 40 and the metal plate 60, and through deformation easily absorbs an external force generated according to a difference in the coefficient of thermal expansion between the substrate 40 and the metal plate 60.

The adhesive layer 61 may have a minimum thickness in which the adhesive layer 61 having been deformed by thermal expansion of the metal plate 60 and the substrate 40 is maintained in a state in which an additional external force is applied to the substrate 40.

The first display module 30A may include an adhesive member 82 provided to couple the frame 15 to the first display module 30A.

The adhesive member 82 may be disposed on the rear surface of the metal plate 60 for the metal plate 60 to be bonded the frame 15.

As described above, the metal plate 60 is formed to have a size corresponding to the size of the substrate 40 and covers the entire area of the rear surface 43 of the substrate 40, and the adhesive member 82 may be disposed on the rear surface of the metal plate 60.

However, embodiments of the disclosure are not limited thereto, and the adhesive member 82 may be provided to be disposed on the rear surface 43 of the substrate 40. In this case, the substrate 40 may be directly bonded to the frame 15 through the adhesive member 82.

According to another embodiment of the disclosure, the metal plate 60 may be provided to cover only a portion of the rear surface 43 of the substrate 40, and the metal plate 60 covers the rear surface 43 of the substrate 40. The adhesive member 82 may be provided to be bonded to an area of the rear surface 43 of the substrate 40 that is not covered by the metal plate 60.

According to embodiments, the adhesive member 82 may include a double-sided tape.

Hereinafter, the front cover 70 and the side cover 90 will be described in detail.

Figure 8:
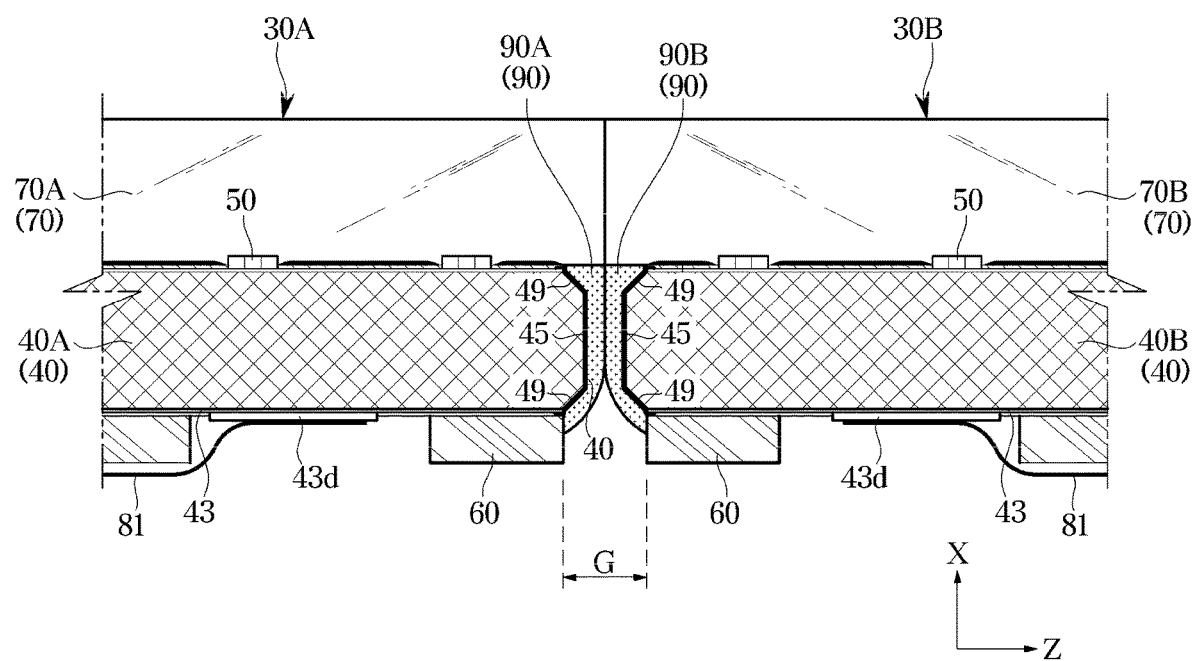
FIG. 8 is a cross-sectional view illustrating some components of the display module shown in FIG. 1, which is taken along the third direction.
Figure 9:
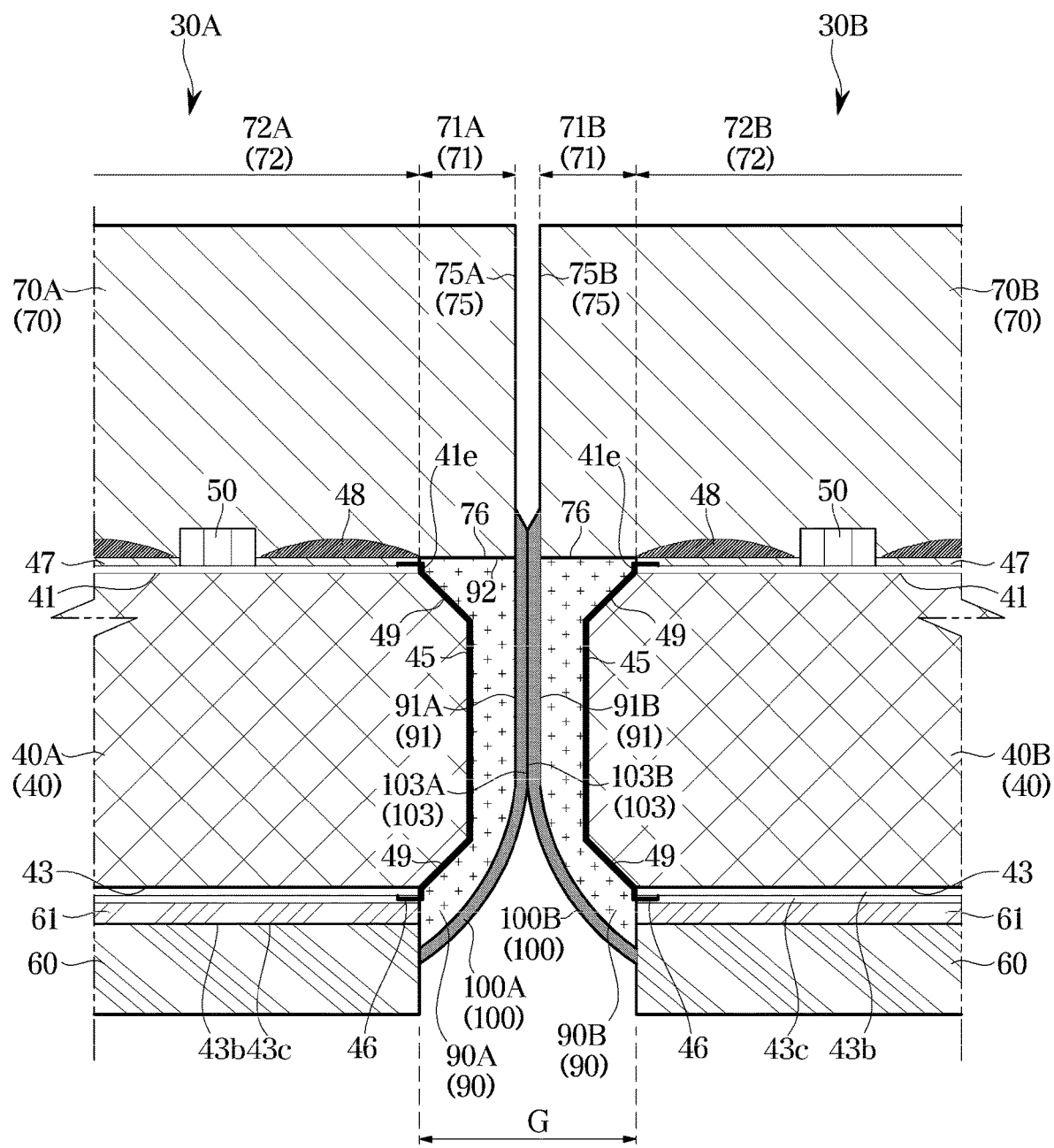
FIG. 9 is an enlarged cross-sectional view illustrating some components shown in FIG. 6.
Figure 10:
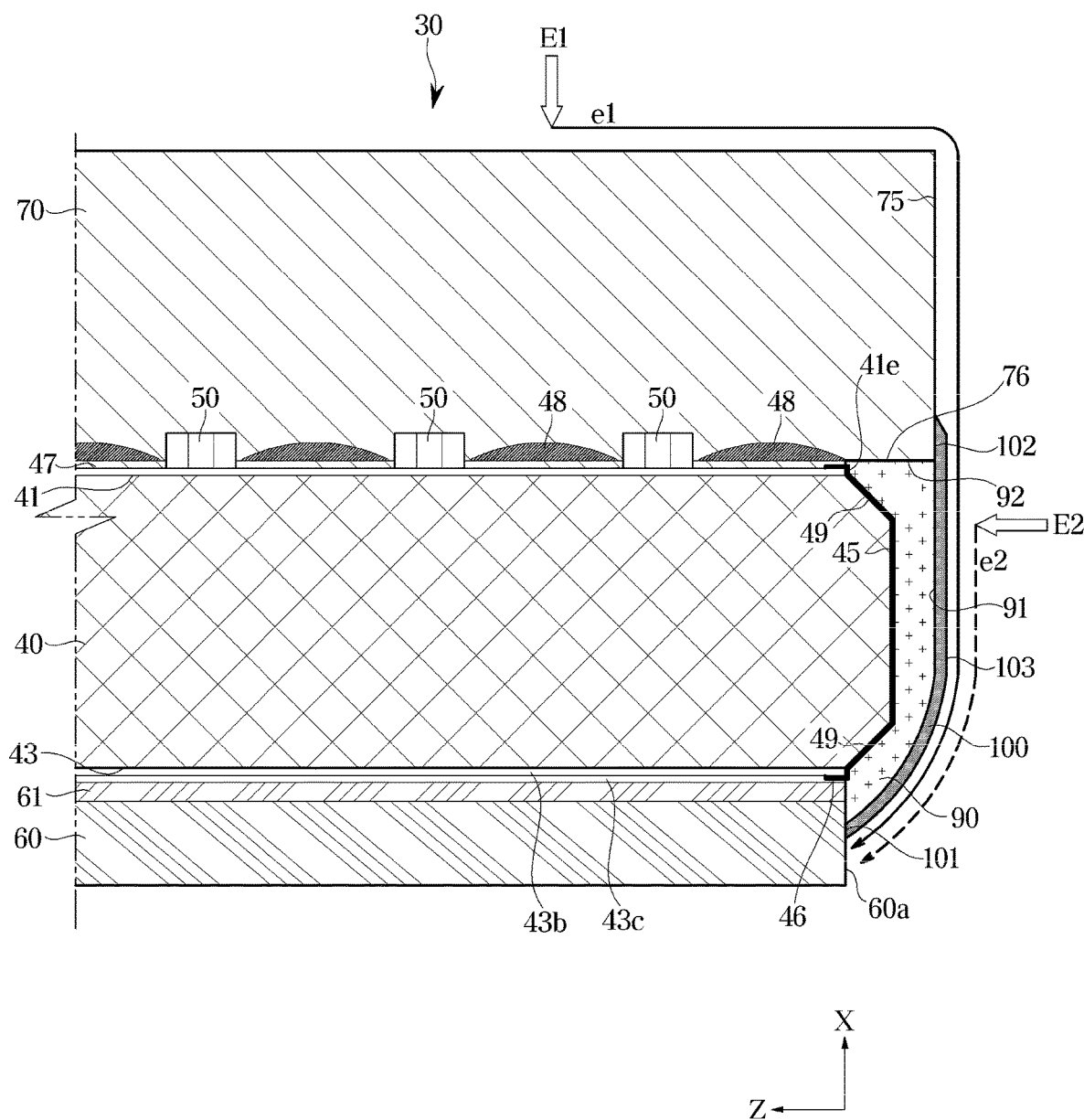
FIG. 10 is an enlarged cross-sectional view illustrating some components shown in FIG. 7.

FIG. 6 is a cross-sectional view illustrating some components of the display apparatus shown in FIG. 1, which is taken along the second direction Y, FIG. 7 is a cross-sectional view illustrating some components of the display apparatus shown in FIG. 1, which is taken along the third direction Z, FIG. 8 is a cross-sectional view illustrating some components of the display module shown in FIG. 1, which is taken along the third direction Z, FIG. 9 is an enlarged cross-sectional view illustrating some components shown in FIG. 6, and FIG. 10 is an enlarged cross-sectional view illustrating some components shown in FIG. 7;

The front cover 70 may protect the substrate 40 from external force and may reduce the revelation of a seam formed by a gap G formed between the plurality of display modules 30A to 30P, and decrease color deviation between the plurality of display modules 30A to 30P.

The plurality of display modules 30A to 30P may each include a side cover 90 disposed in a gap G formed between the plurality of display modules 30A to 30P when the plurality of display modules 30A to 30P are arrayed.

In order to absorb light reflected from the gaps G between the plurality of display modules 30A to 30P, the front cover 70 of each of the plurality of display modules 30A to 30P may be formed to extend an area outside the substrate 40 of each of the plurality of display modules 30A to 30P.

In detail, the front cover 70 may be provided to extend to areas outside the edges 41e of the mounting surface 41 of the substrate 40 in the second direction Y and the third direction Z (see FIG. 5).

Substantially, a gap between the display modules 30A to 30P may be formed between the side surface 45 of each substrate 40 of the display modules 30A to 30P, but since the gap G according to an embodiment refers to a non-display area that may be formed between the display modules 30A to 30P, the gap G formed between the plurality of display modules 30A to 30P should be understood as a gap from one of the edges 41e of the mounting surface 41 of the substrate 40 of one of the display modules 30A to 30P to another one of the edges 41e of the mounting surface 41 of the substrate 40 of another one of the display modules 30A to 30P adjacent thereto.

Therefore, the gap G formed between the plurality of display modules 30A to 30P refers to a gap formed between one of the edges 41e of the mounting surface 41 of one of the display modules 30A to 30P and another one of the edges 41e of the mounting surface 41 of another one of the display modules 30A to 30P adjacent thereto in the second direction Y or the third direction Z.

The front cover is arranged in the gap G between the plurality of the substrate 40 to absorb light transmitted to the gap G or light reflected from the gap G, thereby minimizing the perception of a seam.

In addition, as will be described below, light directed to the gap G may be absorbed by the side cover 90 of the plurality of display modules 30A to 30P disposed within the gap G, so that the perception of the seam may be minimized.

Referring to FIGS. 6 and 7, the front cover 70 may extend to the outside of the substrate 40 in the second direction Y. In detail, the front cover 70 may be provided to extend to an area outside the side surface 45 and the chamfered portion 49 in the second direction Y.

An embodiment is described in relation to one edge of the substrate 40 corresponding to the right edge 31 of the first display module 30A, but the front cover 70 may extend to areas outside the four edges E of the substrate 40 in the second direction Y or the third direction Z.

That is, a side end portion 75 of the front cover 70 corresponding to edges of the front cover 70 may extend to areas outside the four edges E of the substrate 40 in the second direction Y or the third direction Z.

The front cover 70 may include a plurality of layers (not shown) each having a different optical property. The plurality of layers (not shown) may be stacked one on top of the other in the first direction X.

Among the plurality of layers, one layer may be provided as an anti-glare layer. However, an embodiment is not limited thereto, and the one layer may be provided as an anti-reflective layer or a layer in which an anti-glare layer and an anti-reflective layer are mixed.

Among the plurality of layers, another layer may be provided as a light transmittance control layer. However, an embodiment is not limited thereto, and the other layer may be formed of a layer including different physical property or material or having a different function. For example, the other layer may be provided as a circularly polarized light layer.

In addition, the embodiment is not limited thereto, and the plurality of layers may be provided as a single layer. The single layer may be provided as a layer capable of functionally implementing each of the plurality of layers (not shown).

As described above, the front cover 70 may include an adhesive layer (not shown), and the adhesive layer (not shown) may be disposed at the rearmost side of the plurality of layers (not shown) to be bonded to the mounting surface 41.

Accordingly, the front cover 70 may be closely bonded to the mounting surface 41, and protect components mounted on the mounting surface 41, so that the display module 30 enables the front cover 70 to be directly bonded to the substrate 40 without having an additional molding configuration disposed between the front cover 70 and the substrate 40.

In addition, embodiments of the disclosure re not limited thereto, and the plurality of layers (not shown) and the adhesive layer may be formed as a single component.

The front cover 70 may diffusely reflect the light incident from the outside so as to prevent the externally incident light from being regularly reflected and dazzling the user.

As light incident from the outside is diffusely reflected, a glare phenomenon may be reduced and the contrast of a screen displayed on the display panel 20 may be improved.

The front cover 70 may be reduce the transmittance of incident external light or the transmittance of external light reflected from the substrate 40 and the gap G.

The front cover 70 according to an embodiment includes a material of a component that lowers the transmittance of light so as to allow at least a part of light to be transmitted to the substrate 40 therethrough or absorb at least a part of light reflected from the substrate 40 and proceeding in the first direction X.

When a plurality of substrates are produced, some substrates may have different colors due to process errors during the production. Accordingly, substrates having different unique colors may be tiled to form a single display panel.

As described above, the front cover 70 according to an embodiment absorbs at least a part of light reflected from the substrate 40 and transmitted towards the outside, thereby increasing the sense of unity of the screen of the display panel 20.

That is, the front cover 70 may reduce the color deviation of each display module 30A to 30P occurring due to process errors of the display module 30A to 30P by lowering the external light transmittance.

The front cover 70 may prevent external light incident onto the display panel 20 from being transmitted to the substrate 40, and may absorb a part of light incident onto the display panel 20 from the outside or absorb a part of external light reflected from the substrate 40 and transmitted towards the outside of the display panel 20 to improve the contrast of a screen displayed on the display panel. Such different optical actions may be individually implemented through the above-described plurality of layers (not shown).

That is, the front cover 70 may be disposed in front of the substrate 40 in the first direction X to improve the contrast that may be degraded by external light on the screen displayed on the display panel 20.

As described above, in the case of the display module 30 according to an embodiment, the front cover 70 may extend to an area outside the substrate 40 in the second direction Y.

Accordingly, a part of the light introduced into the gap G formed between the plurality of display modules 30A to 30P may be blocked by at least a part of the front cover 70 disposed in the gap G, and at least a part of external light introduced into the gap G or reflected in the gap G may be absorbed by the front cover 70 disposed in the gap G and prevented from being transmitted to the outside. Accordingly, the revelation of a seam formed in the gap G may be reduced, and the sense of unity of the screen displayed on the display panel 20 may be improved as the revelation of the seam decreases.

In detail, the side end portion 75 of the front cover 70 in the second direction Y may be arranged at an area outside the edges 41e of the mounting surface 41 in the second direction Y, or in the gap G.

Accordingly, the front cover 70 may include a first region 71 disposed at an area outside one of the edges 41e of the mounting surface 41 in the second direction Y or disposed in the gap G, and a second region 72 disposed on the mounting surface 41.

The first region 71 and the second region 72 of the front cover 70 may be divided by an end of a gap G in the second direction Y.

The first region 71 of the front cover 70 is disposed in the gap G so that external light directed to the gap G may be blocked by the first region 71 of the front cover 70, or light reflected from the gap G and then directed to the outside is blocked by the first region 71 of the front cover 70 so that the revelation of a seam, which may be formed by the gap G as a boundary between the plurality of display modules 30A to 30P, is reduced and the sense of unity of the display panel 20 is improved.

The front cover 70 may be provided to extend to an area outside the four edges 41e of the mounting surface 41 of the substrate 40 as described above, thereby reducing revelation of a seam that may be formed at each of the edges of the plurality of display modules 30A to 30P.

Taking the first display module 30A and the second display module 30E as an example, the first region 71A of the first front cover 70A may be disposed in the gap G formed between the first display module 30A and the second display module 30E.

In the gap G, side end portions 75A and 75E adjacent to each other among side end portions of the first front cover 70A and the second front cover 70E of the first display module 30A and the second display module 30E may be disposed.

In addition, the plurality of the side surface 45 and the plurality of the chamfered portion 49 of the first display module 30A and the second display module 30E may be disposed in the gap G.

The second region 72A of the first front cover 70A may be disposed on the mounting surface 41 of the first display module 30A.

The first region 71E of the second front cover 70E may be disposed in the gap G formed between the first display module 30A and the second display module 30E, and the second region 72E of the second front cover 70E may be disposed on the mounting surface 41 of the second display module 30E.

That is, in the gap G formed between the first display module 30A and the second display module 30E, the first region 71A and the first region 71E of the first front cover 70A and the second front cover 70E are arranged in parallel to each other in the second direction Y.

The first region 71A and the first region 71E of the first cover 70A and the second front cover 70E may each extend in the second direction Y by a length equal to or less than half of the gap G.

Accordingly, when the first region 71A and the first region 71E of the first cover 70A and the second front cover 70E are arranged in parallel to each other in the second direction Y, the summation of the lengths of the first region 71A and the first region 71E may be equal to or smaller than the length of the gap G in the second direction Y.

According to an embodiment, when the first region 71A and the first region 71E of the first cover 70A and the second front cover 70E are arranged in parallel to each other in the second direction Y, a predetermined spacing may exist between one of the side end portions 75A of the first front cover 70A and one of the side end portions 75E of the second front cover 70E.

As will be described below, a side end member 100 may be disposed on the side end portion 75 of the front cover 70 and a side end portion 91 of the side cover 90 in the second direction Y, so that a separation may formed between the first display module 30A and the second display module 30E.

However, since the side end member 100 is provided in the form of a substantially thin film and formed to have a very thin thickness, the separation may be negligible. Accordingly, the first display module 30A and the second display module 30E may be tiled without a substantially large separation between the first region 71A of the first front cover 70A and the first region 71E of the second front cover 70E.

As described above, in the gap G between the first display module 30A and the second display module 30E, the first region 71A of the first front cover 70A and the first region 71E of the second front cover 70E may be arranged.

External light directed to the display panel 20 is transmitted through the first region 71A and the first region 71E of the first front cover 70A and the second front cover 70E, by which the external light is diffusely reflected to the outside or is partially absorbed by the first region 71A and the first region 71E, so that the amount of light reaching the gap G is reduced and the revelation of the boundary between the first display module 30A and the second display module 30E due to the gap G may be reduced.

In addition, light reflected from the gap G and directed to the outside of the display panel 20 is transmitted through the first region 71A and the first region 71E of the first front cover 70A and the second front cover 70E, by which the light is diffusely reflected outside of the display panel 20 or partially absorbed by the first region 71A and the first region 71E so that the amount of light transmitted to the outside of the display panel 20 is reduced and the revelation of the boundary between the first display module 30A and the second display module 30E due to the gap G may be reduced.

That is, the amount of external light introduced into the gap G formed between the plurality of display modules 30A to 30P may be reduced while at least part of external light reflected from the gap G may be absorbed, so that the sense of unity of the screen of the display panel 20 may be improved.

Additionally, even when the first substrate 40A of the first display module 30A and the second substrate 40E of the second display module 30E have different colors, when each of the first substrate 40A and the second substrate 40E is displayed to the outside by reflection of external light, at least a part of the reflected light is absorbed by a corresponding one of the first front cover 70A and the first front cover 70E, so that the unique color of each of the first substrate 40A and the second substrate 40E is not perceived to the outside, so that the sense of unity of the screen may be improved.

The first display module 30A may include the side cover 90 disposed below the front cover 70 in a direction in which the mounting surface 41 faces, and provided on the side surface 45 of the substrate 40.

In detail, the side cover 90 may be disposed in a space formed on a lower end 76 of the first region 71 of the front cover 70 in the first direction X and the side surface 45 of the substrate 40 in the second direction Y.

The side cover 90 may be provided to be bonded to at least a portion of the lower end 76 of the first region 71, the side surface 45, and the metal plate 60. According to embodiments, the side cover 90 may be provided to be bonded to the entire area of the lower end 76 of the first region 71. In addition, according to embodiments, the side cover 90 may be provided to cover the entire area of the side surface 45.

Here, the lower end 76 of the first region 71 refers to the lower surface of the entirety of the front cover 70, that is, a rear surface of the adhesive layer 130 formed at the rearmost end of the front cover 70.

In addition, the side cover 90 may be provided to cover each of the pair of the plurality of the chamfered portion 49 disposed in the front-rear direction of the side surface 45 in the first direction X.

The side cover 90 may be provided to surround the entire area of the chamfered portion 49, formed between the mounting surface 41 and the side surface 45, as well as the side surface 45.

As the side cover 90 is provided to surround the chamfered portion 49 formed between the mounting surface 41 and the side surface 45, the side cover 90 may fill all spaces that may be generated between the substrate 40 and the front cover 70.

Accordingly, the side cover 90 may prevent foreign substances or moisture from entering the space between the substrate 40 and the front cover 70 from the outside.

In addition, as the side cover 90 is provided to surround the chamfered portion 49 formed between the rear surface 43 and the side surface 45, the side cover 90 may fill all spaces that may be generated between the substrate 40 and the metal plate 60.

Accordingly, the side cover 90 may prevent foreign substances or moisture from entering the space between the substrate 40 and the metal plate 60 from the outside.

The side cover 90 may be provided to come in contact with the lower end 76 of the first region 71 and the chamfered portion 49 and the side surface 45 of the substrate 40. Accordingly, the side cover 90 may support the lower end 76 of the first region 71 and the chamfered portion 49 and the side surface 45 of the substrate 40.

As described above, the front cover 70 and the substrate 40 are bonded to each other by the front cover 70, and the adhesiveness between the front cover 70 and the substrate 40 may be strengthened by the side cover 90. Accordingly, the side cover 90 may prevent the front cover 70 from being separated from the substrate 40.

That is, the reliability of the first display module 30A may be increased by the side cover 90.

In addition, the substrate 40 and the metal plate 60 are bonded to each other by the adhesive layer 61, and the adhesion between the metal plate 60 and the substrate 40 may be strengthened by the side cover 90. Accordingly, the side cover 90 may prevent the metal plate 60 from being separated from the substrate 40.

As described above, the side surface 45 of the substrate 40 is provided to correspond to the four edges 41e of the mounting surface 41, and the first region 71 of the front cover 70 may extend to an area outside the four edges 41e of the mounting surface 41 in the second direction Y and the third direction Z, that is, the directions in which the mounting surface 41 extends.

The side cover 90 may be provided to surround the lower end 76 of the first region 71 and the side surface 45 corresponding to the four edges 41e of the mounting surface 41 along the circumferences of the four edges 41e of the mounting surface 41.

That is, the side cover 90 may be provided to seal the entire edge of the portion where the substrate 40 and the front cover 70 are bonded to each other.

The side cover 90 may cover the lower end 76 of the first region 71 and the side surface 45 in each direction perpendicular to the first direction X.

Accordingly, the coupling between the front cover 70 and the substrate 40 may be improved, and the front cover 70 and the side surface 45 of the substrate 40 may be protected from external forces.

In addition, as described above, the side cover 90 may prevent external moisture or foreign substances from penetrating between the substrate 40 and the front cover 70. Additionally, when some gaps are formed due to an adhesive failure between the substrate 40 and the front cover 70, the side cover 90 may prevent external moisture or foreign substances from penetrating into the gaps.

The side cover 90 is provided to surround all four edges E of the substrate 40 along the side surface 45 of the substrate 40, thereby sealing spaces between the substrate 40, the front cover 70, and the metal plate 60.

Accordingly, the side cover 90 may prevent foreign substances or moisture from penetrating between the substrate 40 and the front cover 70 even when foreign substances or moisture enter the substrate 40 in any direction.

As described above, the rearmost end of the front cover 70 in the first direction X is provided as the adhesive layer 130, and the lower end 76 of the first region 71 is provided as the rear surface of the adhesive layer 130.

Accordingly, when the lower end 76 of the first region 71 is exposed to the outside, foreign substances flowing from the outside may be attached to the lower end 76 of the first region 71.

When the plurality of display modules 30A to 30P are arrayed in a state in which foreign substances are attached to the lower end 76 of the first region 71, the foreign substances attached to the lower end 76 of the first region 71 may increase the visibility of a seam generated between the plurality of display modules 30A to 30P.

However, the first display module 30A according to an embodiment includes the side cover 90, and the side cover 90 is provided to cover the lower end 76 of the first region 71, so that foreign substances are prevented from being attached to the lower end 76 of the first region 71.

Accordingly, when the plurality of display modules 30A to 30P are arrayed, the visibility of a seam generated between the plurality of display modules 30A to 30P due to foreign substances attached to the front cover 70 may be reduced.

In addition, as will be described below, due to electro static discharge (ESD) that may be generated on the display modules 30A to 30P, an electric current may flow into the plurality of electrical components mounted on the substrate 40 and damage the electrical components in comparative embodiments. However, the side cover 90 may seal the substrate 40 from the outside, blocking the inflow of electric charges generated by ESD into the substrate 40, to prevent damage of electrical components.

That is, the substrate 40 is sealed by the front cover 70 and the side cover 90 to prevent electric charges generated by an ESD from passing through the front cover 70 and the side cover 90 to prevent electric charges from flowing to the substrate 40, and as electric charges moving on the front cover 70 and the side cover 90 are guided to the metal plate 60 being in contact with the side cover 90, a path of current based on ESD is provided. Accordingly, the ESD withstand voltage of the electric components mounted on the substrate 40 may be improved.

In addition, the side end member 100 disposed on the outside of the side cover 90 allows the electric charges flowing on the front cover 70 and the side cover 90 to be more easily guided to the metal plate 60, providing a path of current based on ESD, which will be described below in detail.

As described above, the side cover 90 may be provided to be disposed below the front cover 70 in a direction opposite of which the mounting surface 41 faces. That is, the side cover 90 is not disposed above the lower end 76 in the first direction X.

An upper end 92 of the side cover 90 in the first direction X is provided in contact with the lower end 76 of the first region 71, and is not disposed in front of the lower end 76 of the first region 71 in the first direction X.

This is to avoid the side cover 90 from being disposed on a movement path of light emitted from the plurality of inorganic LEDs 50.

When at least a portion of the side cover 90 is disposed in front of the lower end 76 or the front cover 70 in the first direction X, the at least a portion of the side cover 90 maybe disposed on the path of light that moves forward through the front cover 70.

That is, because the side cover 90 absorbs or diffusely reflects a portion of the moving light, a portion of an image displayed on the display panel 20 may be distorted.

However, the side cover 90 according to the embodiment is disposed behind the front cover 70 in the first direction X and does not restrict the movement of light emitted by the plurality of inorganic LEDs 50 so that the image quality of the display panel 20 may be improved.

The side end portion 75 of the front cover 70 in the second direction Y and the side end portion 91 of the side cover 90 in the second direction Y are disposed on the substantially same line in the first direction X.

This is because the front cover 70 and the side cover 90 are simultaneously cut during the manufacturing process of the first display module 30A, as will be described below. In addition, the side end member 100 may be bonded to the side end portion 75 of the front cover 70 and the side end portion 91 of the side cover 90 disposed on the substantially same line in the first direction X.

That is, when the plurality of display modules 30A to 30P are arrayed, the spacing formed between the plurality of display modules 30A to 30P is minimized, and a seam visually recognized by the spacing between the plurality of display modules 30A to 30P may be minimized.

The side cover 90 may include a material that absorbs light. For example, the side cover 90 may be formed of an opaque material or a translucent material.

In addition, the side cover 90 may include a photosensitive material. For example, the side cover 90 may be formed of a photosensitive optically transparent adhesive resin (optical clear resin, OCR). When the photosensitive material is irradiated with external light having a wavelength other than that of visible light, such as ultraviolet (UV) light, physical properties of the photosensitive material are changed and the color of the photosensitive material may be changed to a dark color.

Accordingly, the side cover 90 is formed of a material configured to be colored dark when irradiated with UV light during the manufacturing process, to absorb light.

The side cover 90 may be provided to have a dark color. The side cover 90 may be provided to have a color darker than that of the front cover 70.

The side cover 90 may be provided to have a color similar to that of the black matrix 48.

Accordingly, light incident to the side cover 90 may be absorbed by the side cover 90 due to the light absorbing material of the side cover 90 without being reflected.

The side cover 90 may be disposed in the gap G formed between the plurality of display modules 30A to 30P together with the first region 71 of the front cover 70 when the plurality of display modules 30A to 30P are arrayed.

Accordingly, the side cover 90 absorbs light introduced into the gap G to thereby minimize light introduced into the gap G and reflected to the outside. Accordingly, the revelation of a seam that may be formed by the gap G between the plurality of display modules 30A to 30P is reduced.

Taking the first display module 30A and the second display module 30E as an example, a first side cover 90A of the first display module 30A and a second side cover 90E of the second display module 30E may be disposed in a gap G formed between the first display module 30A and the second display module 30E, together with the first region 71A of the first front cover 70A and the first region 71E of the second front cover 70E.

In the gap G, side end portions 91A and 91E adjacent to each other among side end portions of the first side cover 90A and the second side cover 90E may be disposed together with the side end portions 75A and 75E adjacent to each other among the side end portions of the first front cover 70A and the second front cover 70E of the first display module 30A and the second display module 30E.

The adjacent side end portions 75A and 75E of the first front cover 70A and the second front cover 70E may be disposed to face each other, and the adjacent side end portions 91A and 91E of the first side cover 90A and the second side cover 90E may be disposed to face each other. In addition, a first side end member 100A disposed at the outermost end of the first display module 30A in the second direction Y and a second side end member 100E disposed at the outermost end of the second display module 30E in a direction toward the first display module 30A with respect to the second direction Y may be disposed to face each other.

According to embodiments, the adjacent side end portions 75A and 75E of the first front cover 70A and the second front cover 70E may be disposed in parallel with each other, the adjacent side end portions 91A and 91E of the first side cover 90A and the second side cover 90E may be disposed in parallel with each other, and adjacent side end portions 103A and 103E of the first side end member 100A and the second side end member 100E may be disposed in parallel with each other.

Accordingly, when the first display module 30A and the second display module 30E are arrayed, the first side end member 100A and the second side end member 100E disposed at the outermost ends of the first display module 30A and the second display module 30E, respectively, in the second direction Y may be arranged parallel to each other and may be surface bound with each other.

That is, in the gap G formed between the first display module 30A and the second display module 30E, the first region 71A and the first region 71E of the first front cover 70A and the second front cover 70E may be arranged side by side in the second direction Y, and the first side cover 90A and the second side cover 90E may be arranged side by side in the second direction Y.

Since the side end portion 75 of the front cover 70 and the side end portion 91 of the side cover 90 are formed on the same line in the first direction X, and the side end members 100 are disposed on the side end portion 75 of the front cover 70 and the side end portion 91 of the side cover 90, a separation formed when the first display module 30A and the second display module 30E are arrayed may be minimized.

The length of the first side cover 90A and the second side cover 90E each extending in the second direction Y is approximately equal to or less than half of the length of the gap G to correspond to the first region 71A and the first region 71E of the first front cover 70A and the second front cover 70E.

In the gap G between the first display module 30A and the second display module 30E, the first region 71A of the first front cover 70A and the first region 71E of the second front cover 70E are disposed, and the first side cover 90A and the second side cover 90E may be disposed behind the first region 71A and the first region 71E in the first direction X, respectively.

As described above, external light incident on the display panel 20 passes through the first region 71A and the first region 71E of the first front cover 70A and the second front cover 70E, by which the external light is diffusely reflected to the outside of the display panel 20 or partially absorbed so that the amount of light reaching the gap G is reduced.

Additionally, even when some light reaches the gap G, the light introduced into the gap G is absorbed by the first side cover 90A and the second side cover 90E disposed in the gap G, so that the revelation of the boundary between the first display module 30A and the second display module 30E may be reduced.

That is, at the same time as the amount of external light introduced into the gap G formed between the plurality of display modules 30A to 30P is reduced, light reaching the gap G is additionally absorbed, thereby improving the sense of unity of the screen of the display panel 20.

In addition, light might not be absorbed by the first side cover 90A and the second side cover 90E, and may be reflected on the first side cover 90A and the second side cover 90E and directed toward the outside of the display panel 20. However, the light, while passing through the first region 71A and the first region 71E of the first front cover 70A and the third front cover 70B, may be diffusely reflected to the outside of the display panel 20, or partially absorbed by the first region 71A and the first region 71E, so that the amount transmitted to the outside of the display panel 20 is reduced, and thus the revelation of the boundary between the first display module 30A and the second display module 30E due to the gap G may be reduced.

As described above, the side cover 90 is disposed in the gap G formed between the plurality of display modules 30A to 30P when the plurality of display modules 30A to 30P are arrayed, so that the side cover 90 absorbs light reaching the gap G and thus the revelation of the seam that may be perceived due to the gap G may be reduced.

In the above-described example, the front cover 70 is provided to reduce the amount of light reaching the substrate 40 by diffusely reflecting, absorbing, circularly polarizing, or changing the reflection direction of a portion of the light introduced into the display panel 20.

However, an embodiment is not limited thereto, and the front cover 70 may be formed of a transparent material through which light is transmitted without deformation. Even in this case, the revelation of the boundary between the plurality of display modules 30A to 30P due to the gap G may be reduced by the side cover 90 disposed between the plurality of display modules 30A to 30P.

As described above, since the side cover 90 is formed of a material that absorbs light, when at least a portion of the side cover 90 is disposed in front of the front cover 70 in the first direction X, a portion of light emitted from the plurality of inorganic LEDs 50 may be absorbed by the at least a portion of the side cover 90. Accordingly, a part of a screen displayed on the display panel 20 is displayed dark according to a comparative embodiment.

However, the side cover 90 according to an embodiment is disposed below the front cover 70 in the first direction X, in detail, below the lower end 76 of the first region 71, so that light emitted from the plurality of inorganic LEDs 50 is not absorbed, and the brightness of the image displayed on the display panel 20 may be uniform.

Referring to FIGS. 8 and 9, the front cover 70 may be provided to extend to an outside of the substrate 40 in the third direction Z. In detail, the front cover 70 may be provided to extend to an area outside the side surface 45 and the chamfered portion 49 in the third direction Z.

The side end portion 75 of the front cover 70 in the third direction Z may be disposed outside one of the edges 41e of the mounting surface 41 in the third direction Z or may be disposed in the gap G.

The first region 71 and the second region 72 of the front cover 70 may be divided by an end of the gap G in the third direction Z.

Taking the first display module 30A and the third display module 30B as an example, the first region 71A of the first front cover 70A may be disposed in the gap G formed between the first display module 30A and the third display module 30B.

In the gap G, side end portions 75A and 75B adjacent to each other among side end portions of the first front cover 70A and the third front cover 70B of the first display module 30A and the third display module 30B may be disposed.

In addition, the plurality of the side surface 45 and the plurality of the chamfered portion 49 of the first display module 30A and the third display module 30B may be disposed in the gap G.

The first region 71B of the third front cover 70B may be disposed in the gap G formed between the first display module 30A and the third display module 30B, and the second region 72B of the third front cover 70B may be disposed on the mounting surface 41 of the third display module 30B.

That is, in the gap G formed between the first display module 30A and the third display module 30B, the first region 71A and the first region 71B of the first front cover 70A and the third front cover 70B are arranged side by side in the third direction Z.

External light directed to the display panel 20 is transmitted through the first regios 71A and the first region 71B of the first front cover 70A and the third front cover 70B, by which the external light is diffusely reflected to the outside or is partially absorbed by the first region 71A and the first region 71B, so that the amount of light reaching the gap G is reduced and the revelation of the boundary between the first display module 30A and the third display module 30B due to the gap G may be reduced.

In addition, light reflected from the gap G and directed toward the outside of the display panel 20 is transmitted through the first region 71A and the first region 71B of the first front cover 70A and the third front cover 70B, by which the light is diffusely reflected outside of the display panel 20 or partially absorbed by the first region 71A and the first region 71B so that the amount of light transmitted to the outside of the display panel 20 is reduced and the revelation of the boundary between the first display module 30A and the third display module 30B due to the gap G may be reduced.

As described above, the side cover 90 may be disposed in a space formed on the side surface of the substrate 40 in the second direction Y and in a space formed on the side surface of the substrate 40 in the third direction Z.

On the side surface 45 of the substrate 40 that is arranged to face in the third direction Z, the side surface wiring 46 may be disposed. Accordingly, the side cover 90 provided on the side surface 45 disposed to face in the third direction Z may be provided to cover the side surface 45, the chamfered portion 49, and the side surface wiring 46. Accordingly, the side surface wiring 46 is protected from external force, and is prevented from having foreign substances or moisture penetrated thereinto.

That is, the side cover 90 may be provided to surround the lower end 76 of the first region 71 and the side surface 45 corresponding to the four edges 41e of the mounting surface 41 along the circumferences of the four edges 41e of the mounting surface 41 to thereby surround the side surface wiring 46 extending along the side surface 45 in the third direction Z.

Accordingly, the coupling between the front cover 70 and the substrate 40 may be improved, and the front cover 70, and the side surface 45 and the side surface wiring 46 of the substrate 40 may be protected from external forces.

The side end portion 75 of the front cover 70 in the third direction Z and the side end portion 91 of the side cover 90 in the third direction Z are disposed on the same line in the first direction X. The side end portion 75 of the front cover 70 and the side end portion 91 of the side cover 90 in a direction parallel to the first direction X may be disposed on the same line.

Taking the first display module 30A and the third display module 30B as an example, a first side cover 90A of the first display module 30A and a third side cover 90B of the third display module 30B may be disposed in a gap G formed between the first display module 30A and the third display module 30B together with the first region 71A of the first front cover 70A and the first region 71B of the third front cover 70B.

In the gap G, side end portions 91A and 91B adjacent to each other among end portions of the first side cover 90A and the third side cover 90B may be disposed together with the side end portions 75A and 75B adjacent to each other among the side end portions of the first front cover 70A and the third front cover 70B of the first display module 30A and the third display module 30B.

The adjacent side end portions 75A and 75B of the first front cover 70A and the third front cover 70B may be disposed to face each other, and the adjacent side end portions 91A and 91B of the first side cover 90A and the third side cover 90B may be disposed to face each other.

In addition, the first side end member 100A disposed at the outermost end of the first display module 30A in the third direction Z and the third side end member 100B disposed at the outermost end of the third display module 30B in a direction toward the first display module 30A with respect to the third direction Z may be disposed to face each other.

According to embodiments, the adjacent side end portions 75A and 75B of the first front cover 70A and the third front cover 70B may be disposed in parallel with each other, the adjacent side end portions 91A and 91B of the first side cover 90A and the third side cover 90B may be disposed in parallel with each other, and side end portions 103A and 103B of the first side end member 100A and the third side end member 100B may be disposed parallel to each other.

Accordingly, when the first display module 30A and the third display module 30B are arrayed, the first side end member 100A and the third side end member 100B disposed at the outermost end of the first display module 30A and the third display module 30B, respectively, in the third direction Z may be arranged parallel to each other and surface bound with each other.

That is, in the gap G formed between the first display module 30A and the third display module 30B, the first region 71A and the first region 71B of the first front cover 70A and the third front cover 70B may be arranged side by side in the third direction Z, and the first side cover 90A and the third side cover 90B may be arranged side by side in the third direction Z.

Since the side end portion 75 of the front cover 70 and the side end portion 91 of the side cover 90 are formed on the same line in the first direction X, and the side end member 100 is disposed on the side end portion 75 of the front cover 70 and the side end portion 91 of the side cover 90 in the third direction Z, a separation formed when the first display module 30A and the third display module 30B are arrayed may be minimized.

In the gap G formed between the first display module 30A and the third display module 30B, the first region 71A and the first region 71B of the first front cover 70A and the third front cover 70B may be arranged side by side in the third direction Z, and the first side cover 90A and the third side cover 90B may be arranged side by side in the third direction Z.

In the gap G between the first display module 30A and the third display module 30B, the first region 71A of the first front cover 70A and the first region 71B of the third cover 100B are disposed, and the first side cover 90A and the third side cover 90B may be disposed behind the first region 71A and the first region 71B in the first direction X, respectively.

As described above, external light incident on the display panel 20 passes through the first region 71A and the first region 71B of the first front cover 70A and the third front cover 70B, by which the external light is diffusely reflected to the outside of the display panel 20 or partially absorbed so that the amount of light reaching the gap G is reduced.

Additionally, even when some light reaches the gap G, the light introduced into the gap G is absorbed by the first side cover 90A and the third side cover 90B disposed in the gap G, so that the revelation of the boundary between the first display module 30A and the third display module 30B may be reduced.

Light might not be absorbed by the first side cover 90A and the third side cover 90B, and may be reflected on the first side cover 90A and the third side cover 90B and directed to the outside of the display panel 20. However, the light, while passing through the first region 71A and the first region 71B of the first front cover 70A and the third front cover 70B, may be diffusely reflected to the outside of the display panel 20, or partially absorbed by the first region 71A and the first region 71B, so that the amount transmitted to the outside of the display panel 20 is reduced, and thus the revelation of the boundary between the first display module 30A and the third display module 30B due to the gap G may be reduced.

Hereinafter, the side end member 100 will be described in detail.

FIG. 10 is an enlarged cross-sectional view illustrating some components shown in FIG. 7.

In a manufacturing process of a display apparatus for implementing a display panel using a display module, a plurality of display modules may be tiled to form a display panel.

The process of forming the display panel using each display module includes a process of manufacturing and transporting each display module, and in the process, an electrical current generated by ESD may flow into the display module, which may cause electronic parts mounted inside the display module to be broken.

Each display module may need to include a component configured to absorb electric shock to prevent inflow of an electric current according to an ESD occurring from the process before the display module is coupled to the frame 15 and assembled into the display apparatus 1 and thus prevent electronic parts mounted inside the display module from being damaged.

That is, each of the display modules 30A to 30P may include a component configured to independently block the current generated by an ESD from flowing into the electronic parts mounted on the substrate 40, and may include a component configured to easily guide the generated current to the ground configuration formed on each of the display module 30A to 30P without being introduced into the parts mounted on the substrate 40.

Each of the display module 30A to 30P of the display apparatus 1 according to an embodiment of the disclosure may include the side cover 90 formed to extend from the upper portion of the metal plate 60 to the lower end 76 of the first region 71 of the front cover 70 that is disposed outside the mounting surface 41, in the first direction X in which the mounting surface 41 faces, such that the side surface 45 is sealed from the outside.

Since the display modules 30A to 30P have the same configuration, the description will be made with reference to the first display module 30A as a representative.

Referring to FIG. 10, the side cover 90 may be provided to cover not only the outer side of the side surface 45 of the substrate 40 in the third direction Z, but also the outer side of the side surface 45 in the second direction Y.

That is, as described above, the side cover 90 may be provided to surround all of the four edges E of the substrate 40.

Accordingly, the mounting surface 41, which is the front surface of the substrate 40, may be covered by the front cover 70, the rear surface 43 of the substrate 40 may be covered by the metal plate 60, and the plurality of the side surface 45 and the plurality of the chamfered portion 49 may be covered by the side cover 90.

In particular, since the side cover 90 is provided to extend from the upper portion of the metal plate 60 to the lower end 76 of the front cover 70 in the first direction X, the substrate 40 is completely sealed from the outside.

The front cover 70 may be formed of a non-conductive material which does not allow electric charges to pass therethrough.

The side cover 90 may be formed of a non-conductive material which does not allow electric charges to pass therethrough.

As the front cover 70 and the side cover 90 are formed of a non-conductive material, most of the current applied to the front cover 70 or the side cover 90 may flow on the front cover 70 and the side cover 90 without passing through the front cover 70 and the side cover 90.

In addition, the metal plate 60 may be formed of a material having a large capacitance to serve as a ground configuration. Accordingly, when an electric current is applied on the metal plate 60, the potential of the metal plate 60 is maintained at a constant potential so that the current flowing into the metal plate 60 is absorbed by the metal plate 60, and electric current does not flow to the substrate 40 through the metal plate 60.

In particular, in the conventional technology, a side surface wiring extending along the side surface of the substrate is exposed to the outside so that current flows into the side surface wiring according to an ESD, which causes electrical components disposed on the substrate to be damaged.

In the case of the display apparatus 1 according to the embodiment of the disclosure, the entirety of the side surface wiring 46 of the substrate 40 is provided to be surrounded by the side cover 90, and thus sealed without being exposed to the outside. Accordingly, even when static electricity is discharged at a side of the side surface 45 of the substrate, the side cover 90 may prevent current from flow into the side surface wiring 46.

In addition, the display module 30 may include the side end member 100 that is disposed at the outermost side of the side cover 90 in the second direction Y and the third direction Z, and formed of a material having a conductivity higher than that of the side cover 90.

The side end member 100 may be provided to cover not only the outer side of the side surface 45 of the substrate 40 in the third direction Z, as shown in FIG. 10, but also the outer side of the side surface 45 of the substrate 40 in the second direction Y.

That is, the side end member 100 may be provided to surround all four edges E of the substrate 40.

The side end member 100 may be formed of a metal material, and may be formed of a material having a conductivity higher than that of the side cover 90. The side end member 100 may be coated on the side cover 90 to be disposed on the outer end of the side cover 90.

According to embodiments, the one end 101 of the side end member 100 in the first direction X may be provided to be in contact with a side surface 60a of the metal plate 60 in the second direction Y or the third direction Z.

According to embodiments, the other end 102 of the side end member 100 in the first direction X may be provided to be in contact with the side end portion 75 of the front cover 70 in the second direction Y or the third direction Z.

The other end 102 of the side end member 100 in the first direction X may be disposed above the lower end 76 of the front cover 70.

The one end 101 of the side end member 100 in the first direction X may be provided to be disposed below a lower end of the side cover 90.

Accordingly, the side end member 100 may be provided to surround the entire side cover 90 corresponding to the four edges E of the substrate 40 and prevent the side cover 90 from being exposed to the outside.

As described above, the side end member 100 may be formed of a material having a conductivity higher than that of the side cover 90.

In addition, the side end member 100 may be formed of a material having a conductivity higher than that of the front cover 70.

Accordingly, when a current e1 is generated by an ESD E1 on the front cover 70, the current e1 may not pass through the front cover 70 and not flow into the substrate 40, so that the current e1 flowing on the front cover 70 may enter the side end member 100.

The current e1 entering the side end member 100 may flow to the metal plate 60 through the side end member 100.

That is, the side end member 100 may be provided to be in contact with the metal plate 60 to be grounded to a ground configuration.

The side end member 100 may provide a path for the current e1 caused by the ESD E1 generated on the front cover 70 to flow to the metal plate 60 provided as a ground configuration.

In other words, the side end member 100 may guide electric charges due to an ESD to the ground.

In addition, when a current e2 is generated by an ESD E2 on the side end member 100 or the side cover 90, the current e2 may not pass through the side cover 90 and not flow into the substrate 40. The current e2 may flow into the side end member 100 and then to the metal plate 60.

As described above, all of the current e1 due to the ESD E1 on the front cover 70 or the current e2 due to the ESD E2 on the side cover 90 may not flow to the side end member 100 but at least a portion of the current e1 or the current e2 may remain on the front cover 70 or the side cover 90 and may flow through the front cover 70 and the side cover 90 to the substrate 40 side.

However, most of the current e1 due to the ESD E1 on the front cover 70 or the current e2 due to the ESD E2 on the side cover 90 passes through the side end member 100 and flows to the metal plate 60. Accordingly, even when some of the currents e1 and e2 flow toward the substrate 40, the ESD withstand voltage of the electronic parts mounted on the substrate 40 may be improved.

Some of the currents e1 and e2 may flow into the substrate 40 through a boundary between the lower end 76 of the front cover 70 and the upper end 92 of the side cover 90, or between the rear surface 43 of the substrate 40 and the adhesive layer 61.

However, as described above, the other end 102 of the side end member 100 in the first direction X is disposed above the lower end 76 of the front cover 70, and the one end 101 of the side end member 100 is disposed below the lower end of the side cover 90. Accordingly, the boundary, between the lower end 76 of the front cover 70 and the upper end 92 of the side cover 90, or between the rear surface 43 of the substrate 40 and the adhesive layer 61 may be sealed from the outside by the side end member 100.

Accordingly, the amount of some currents e1 and e2 remaining on the front cover 70 and the side cover 90 and flowing into the substrate 40 may be negligible due to the side end member 100. The ESD withstand voltage of the electric components mounted on the substrate 40 may be improved.

That is, the display module 30 may be provided to be sealed from the outside by the front cover 70, the side cover 90, and the side end member 100, and the metal plate 60 disposed on the rear surface 43 of the substrate 40 is formed as a ground configuration. Accordingly, even when a current by an ESD is generated on the front cover 70 or the side cover 90, the current flows into the metal plate 60 through the side end member 100 so that the ESD withstand voltage of the electric components mounted on the substrate 40 may be improved.

As described above, each of the display modules 30A to 30P may independently include the front cover 70, the side cover 90, the metal plate 60, and the side end member 100, which are provided to prevent the penetration of a current according to an ESD.

Accordingly, each of the display modules 30A to 30P, after being equipped with the front cover 70, the side cover 90, the metal plate 60, and the side end member 100, may be protected from electric current that may be generated from an ESD in the subsequent manufacturing process or a transport process.

In addition, even when each of the display modules 30A to 30P is assembled to the frame 15 to form the display apparatus 1, since each of the display modules 30A to 30P independently includes the protective component against an electric current of an ESD, an additional antistatic configuration is not required.

Accordingly, the front cover 70, the side cover 90, the metal plate 60, and the side end member 100 of each of the display modules 30A to 30P may absorb an electric shock caused by an ESD during a process of the plurality of display modules 30A to 30P being manufactured or transported and after a process of the plurality of display modules 30A to 30P being assembled into the display apparatus 1.

Hereinafter, a display module 30 according to another embodiment of the disclosure will be described. Components other than a side cover 90' described below are the same as those of the display module according to the above-described embodiments, and thus descriptions thereof will be omitted.

Figure 11:
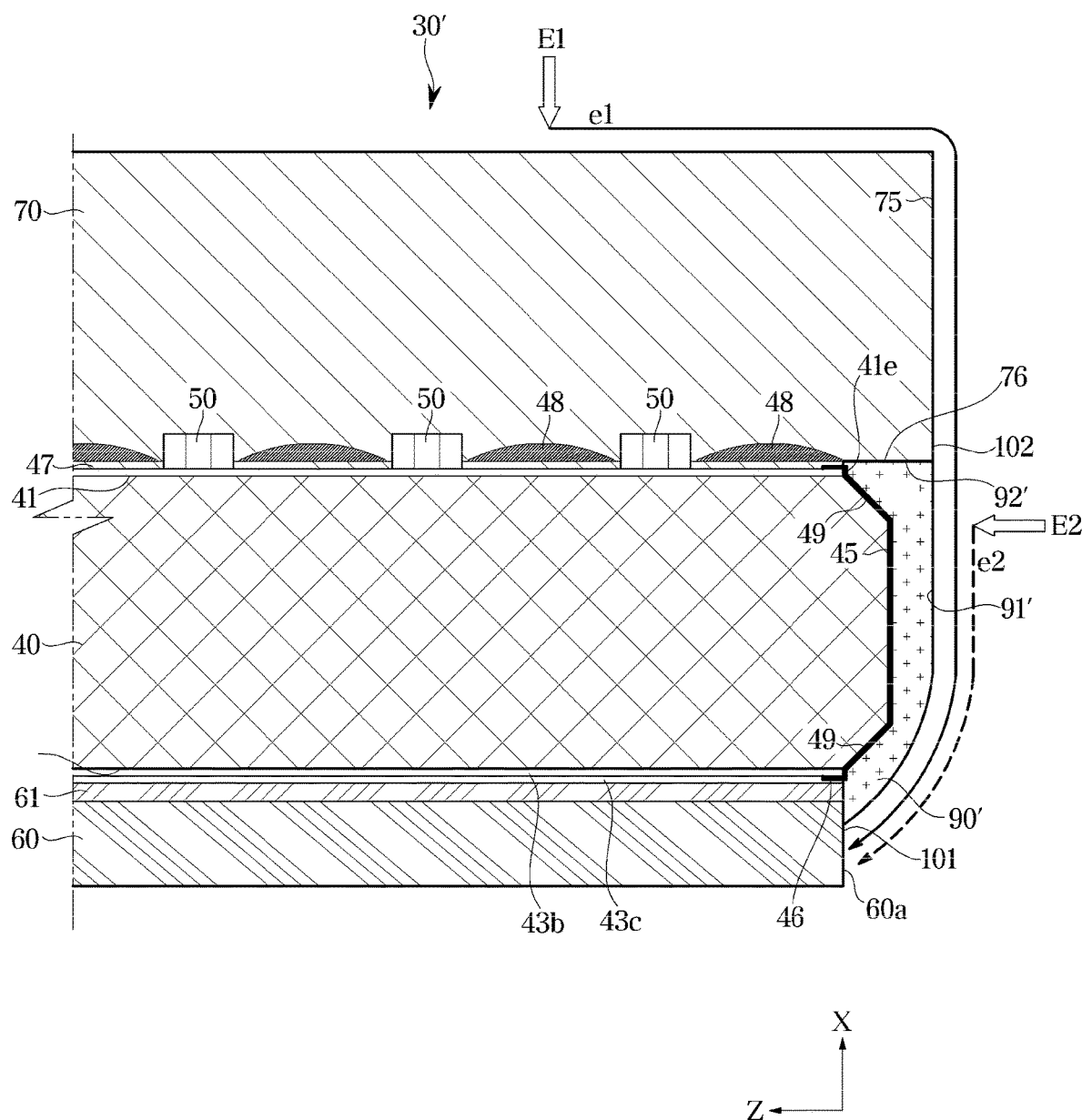
FIG. 11 is an enlarged cross-sectional view illustrating some components of a display module of a display apparatus according to another embodiment.

FIG. 11 is an enlarged cross-sectional view illustrating some components of a display module of a display apparatus according to another embodiment.

Referring to FIG. 11, the display module 30' may not include a side end member 100 as described above.

The side cover 90' according to the embodiment of the disclosure may include a non-conductive material, and may additionally include a material having a mixture of an antistatic agent.

Due to the antistatic agent, electric charges are prevented from being built up on a side end portion 91' on the outside of the side cover 90'.

Accordingly, an ESD E2 is prevented from easily occurring on the side cover 90, and even when a current e2 is generated by the ESD E2, the amount of the current e2 may be negligible. The current e2 may flow on the side cover 90' and flow to the metal plate 60 provided in contact with the side cover 90'.

When a current e1 is generated by an electrostatic discharge E1 on the front cover 70, the current e1 may pass through the front cover 70 and not flow into the substrate 40, so that the current e1 flowing on the front cover 70 may flow to the side cover 90.

The current e1 flowing to the side cover 90' may not pass through the side cover 90' and not flow into the substrate 40, so that the current e1 flowing on the side cover 90' may flow to the metal plate 60 through the side cover 90'.

That is, the side end portion 91' of the side cover 90' may provide a path for the current to flow to the metal plate 60.

Accordingly, unlike the display module 30 according to the above embodiment of the disclosure, the display module 30' according to the embodiment is sealed from the outside by the front cover 70 and the side cover 90' without including the side end member 100, and because the metal plate 60 disposed on the rear surface 43 of the substrate 40 is formed as a ground configuration, a current generated on the front cover 70 or the side cover 90' according to an ESD may flow into the metal plate 60 along the side end portion 91' of the side cover 90', so that the ESD withstand voltage of electrical components mounted on the substrate 40 may be improved.

Hereinafter, a method of manufacturing the first display module 30A according to an embodiment will be briefly described.

Figure 12:
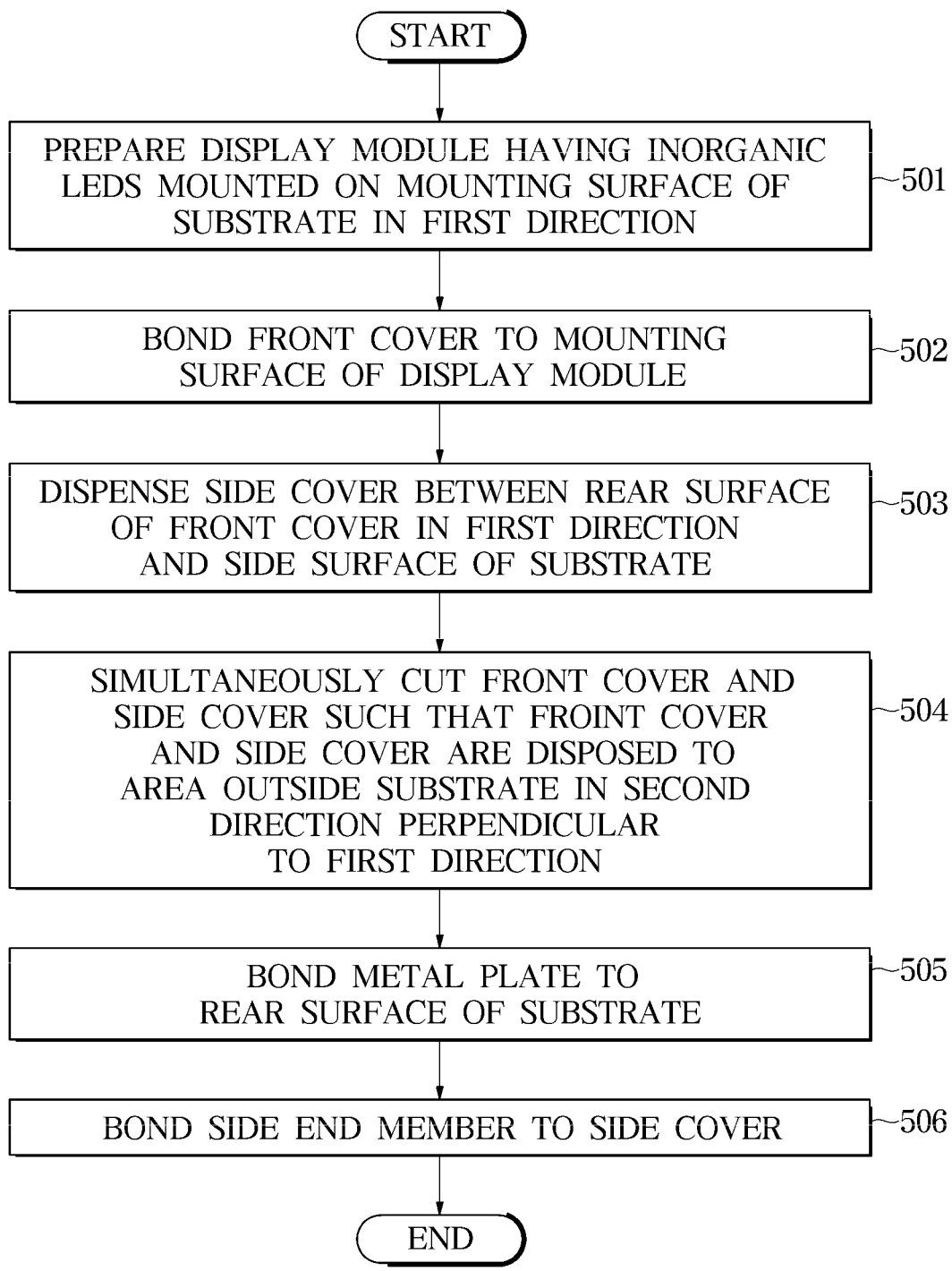
FIG. 12 is a flowchart showing a method of manufacturing a display apparatus according to an embodiment.
Figure 13:
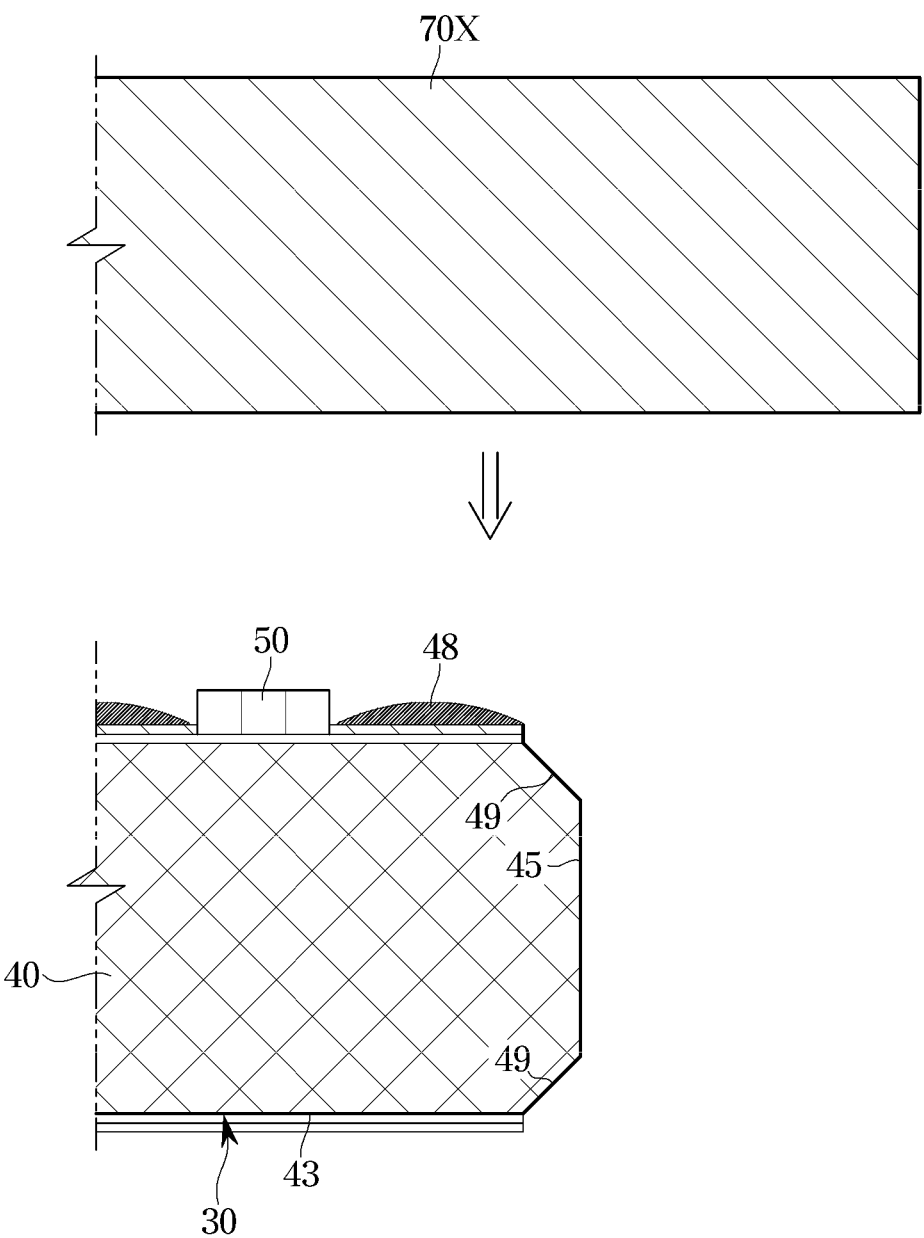
FIG. 13 is a view illustrating a process of manufacturing the display apparatus according to an embodiment.
Figure 14:
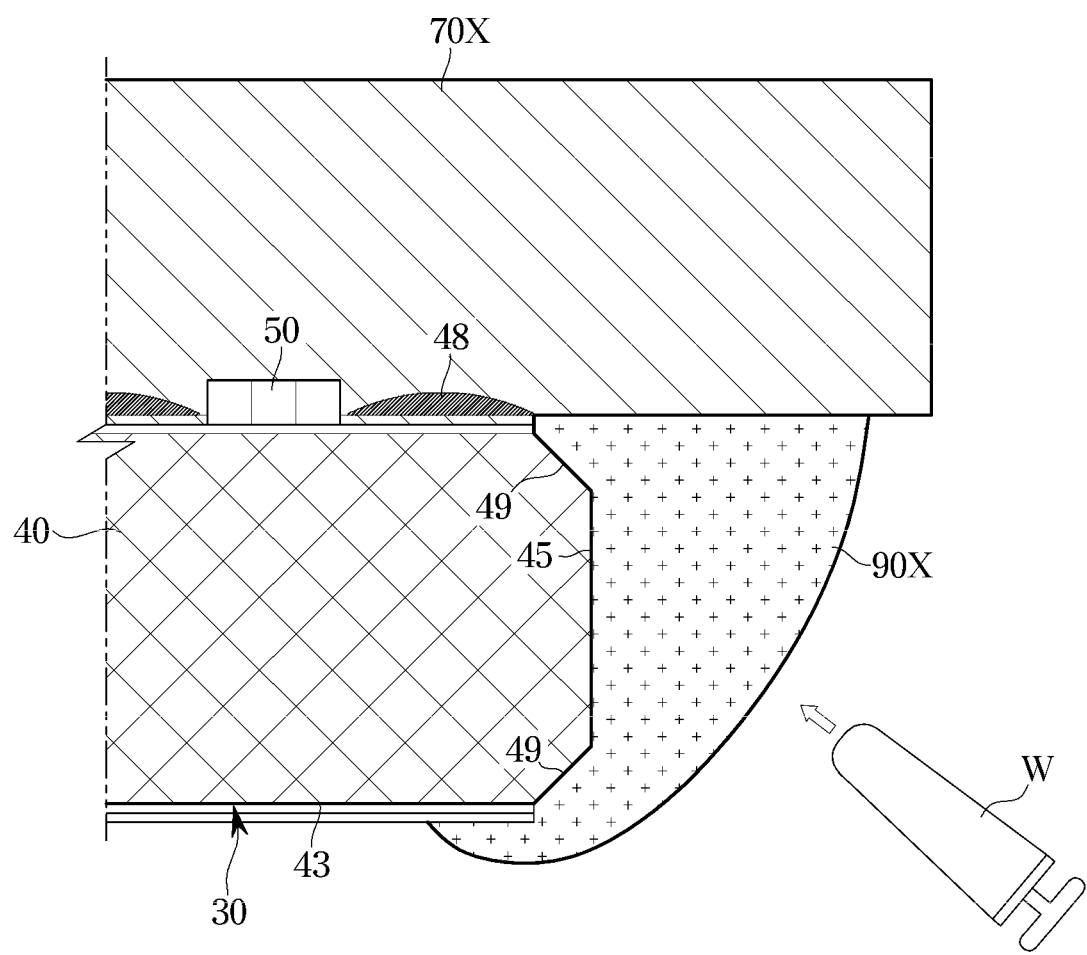
FIG. 14 is a view illustrating a process of manufacturing the display apparatus, which follows the process shown in FIG. 12.
Figure 15:
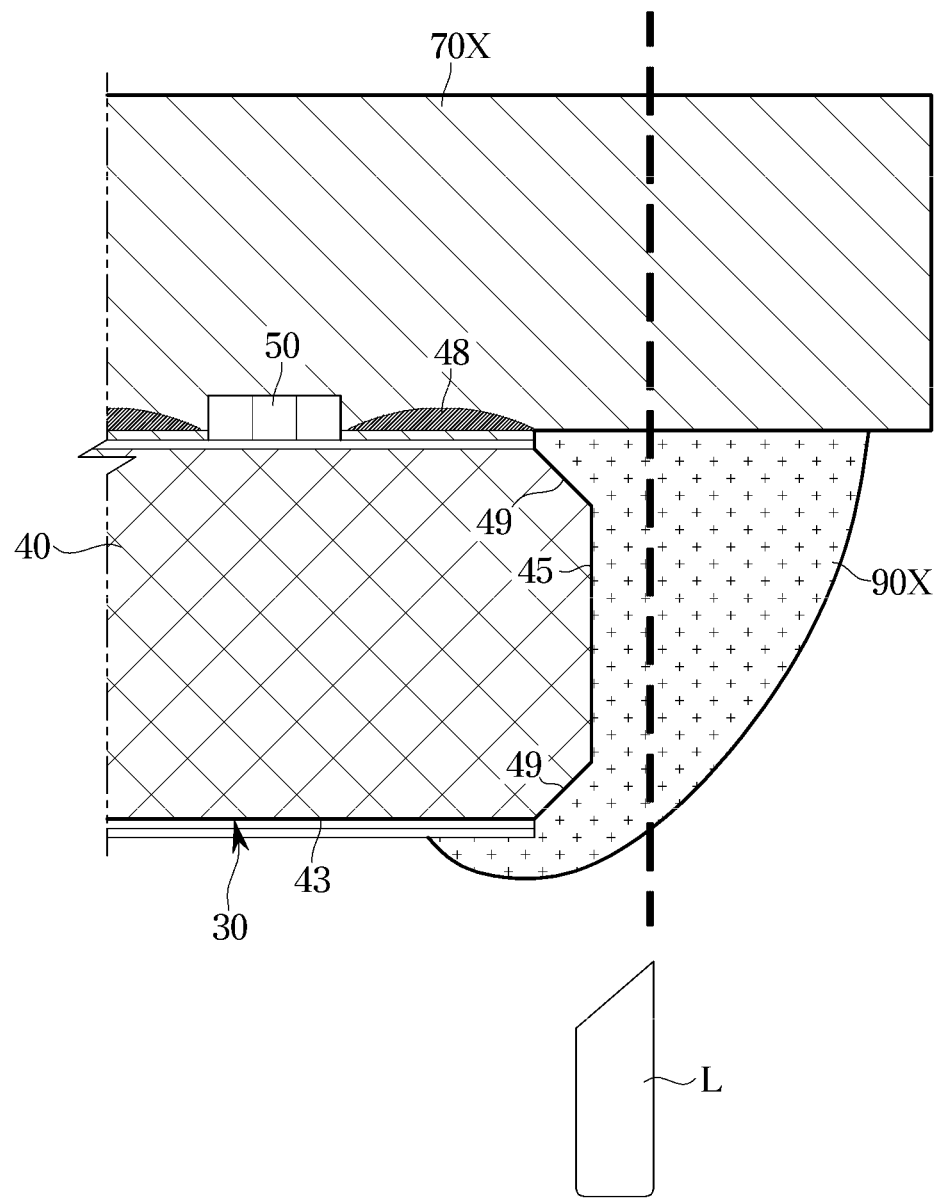
FIG. 15 is a view illustrating a process of manufacturing the display apparatus, which follows the process shown in FIG. 13.
Figure 16:
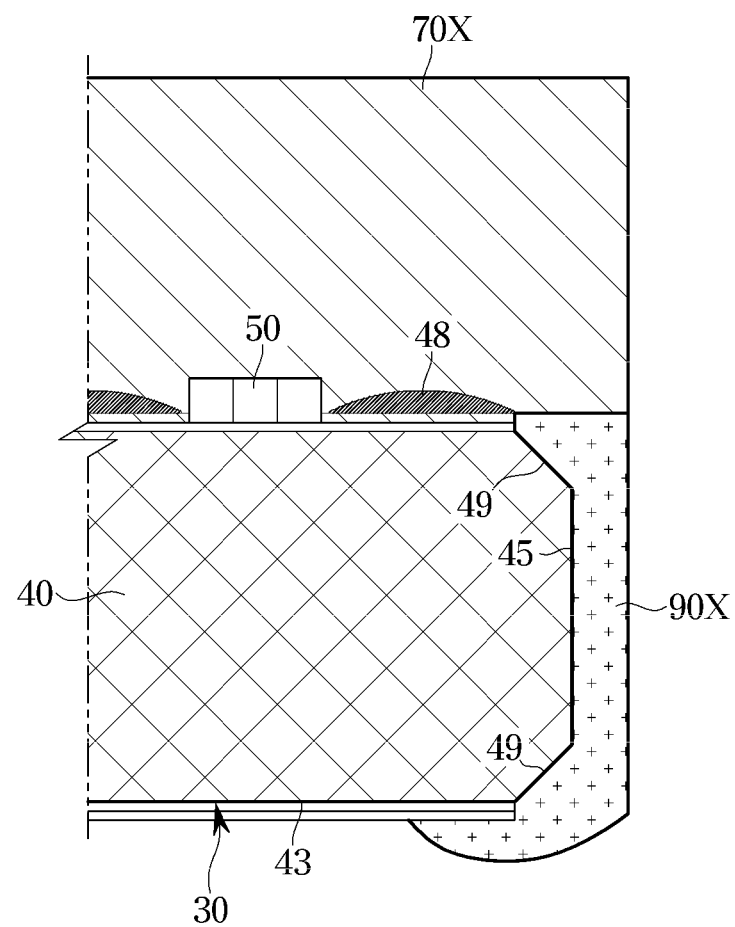
FIG. 16 is a view illustrating a process of manufacturing the display apparatus, which follows the process shown in FIG. 14.
Figure 16:
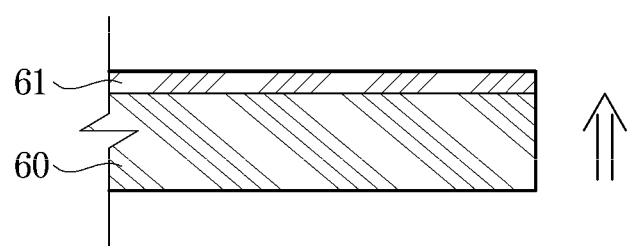
Figure 17:
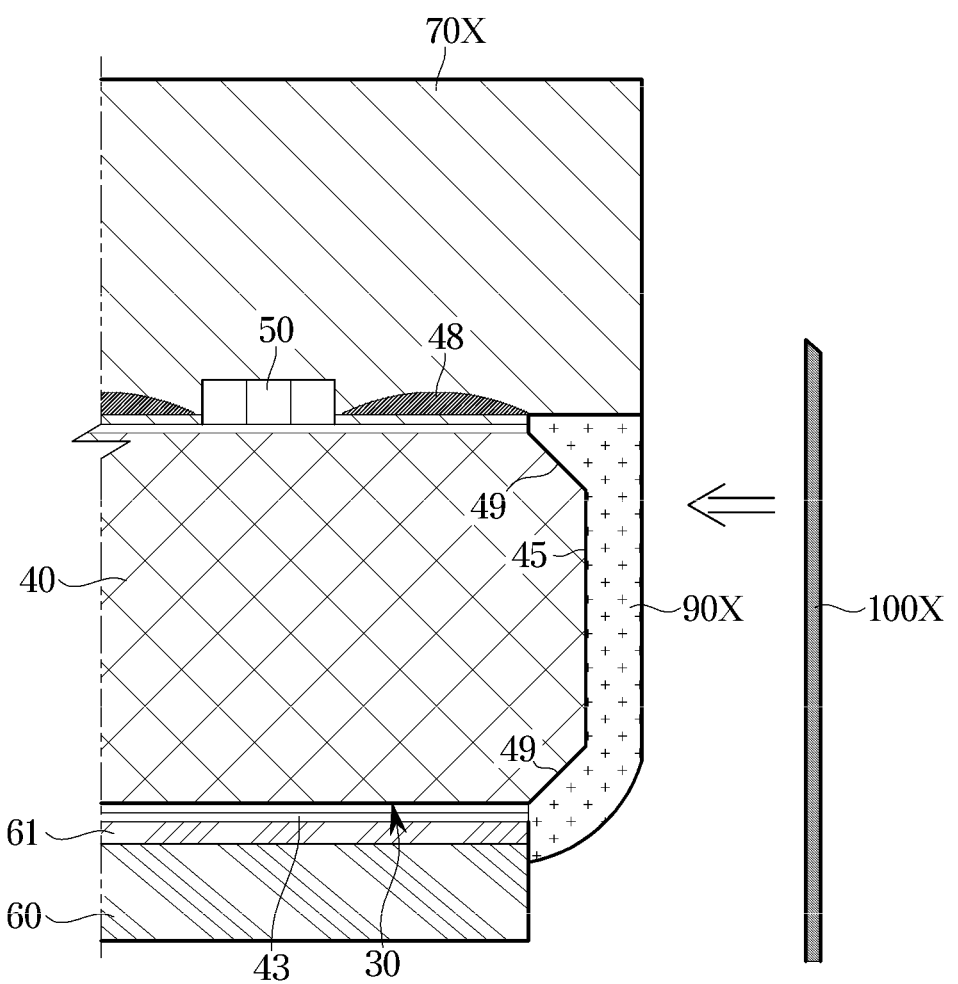
FIG. 17 is a view illustrating a process of manufacturing the display apparatus, which follows the process shown in FIG. 15.
Figure 18:
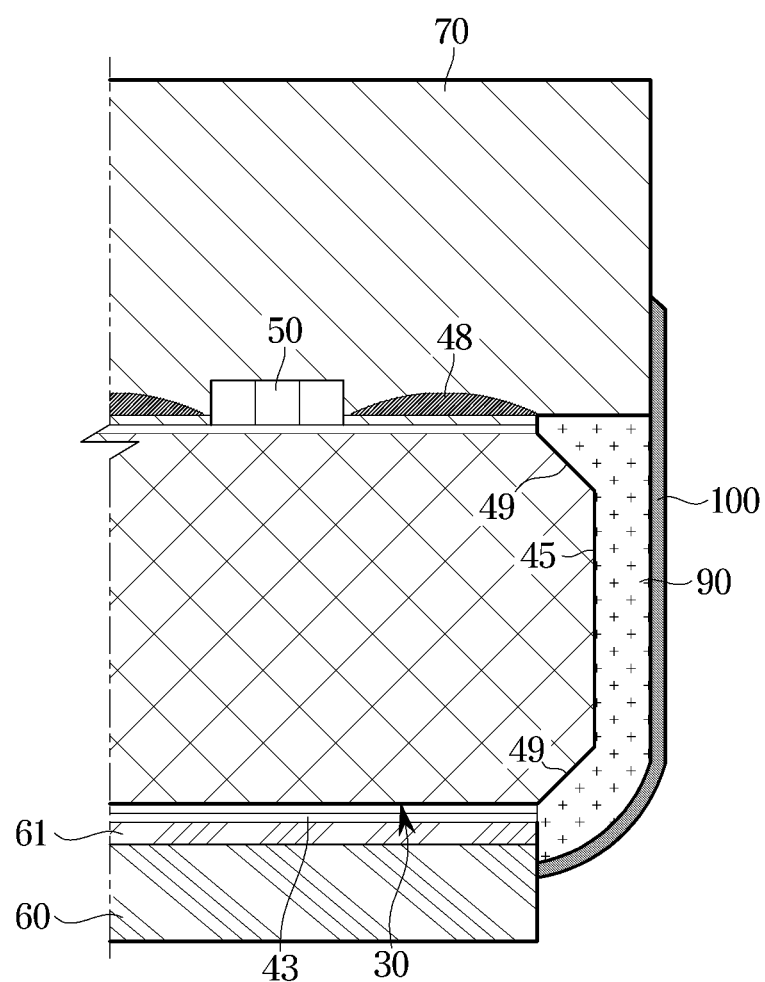
FIG. 18 is a view illustrating a process of manufacturing the display apparatus, which follows the process shown in FIG. 16.

FIG. 12 is a flowchart showing a method of manufacturing a display apparatus according to an embodiment, FIG. 13 is a view illustrating a process of manufacturing the display apparatus according to an embodiment, FIG. 14 is a view illustrating a process of manufacturing the display apparatus, which follows the process shown in FIG. 12, FIG. 15 is a view illustrating a process of manufacturing the display apparatus, which follows the process shown in FIG. 13, FIG. 16 is a view illustrating a process of manufacturing the display apparatus, which follows the process shown in FIG. 14, FIG. 17 is a view illustrating a process of manufacturing the display apparatus, which follows the process shown in FIG. 15, and FIG. 18 is a view illustrating a process of manufacturing the display apparatus, which follows the process shown in FIG. 16.

First, a display module 30 is prepared (501). A plurality of inorganic LEDs 50 are mounted on a mounting surface 41 of a substrate 40 of the display module 30. In addition, a black matrix 48 may be formed between the plurality of inorganic LEDs 50.

Next, as shown in FIG. 13, a front cover 70X is bonded to the mounting surface 41 of the display module 30 (502). The front cover 70X refers to a front cover 70X before being cut. The front cover 70X may cover the entire area of the substrate 40, including the mounting surface 41. The front cover 70X may be formed through a compression hardening process on the mounting surface 41.

Next, as shown in FIG. 14, a side cover 90X is dispensed in a space between a rear surface of the front cover 70X in the first direction X and a chamfered portion 49 formed between the side surface 45 and the mounting surface 41 (503).

Here, the side cover 90X refers to a side cover 90X before being cut together with the front cover 70X.

The side cover 90X may be applied in a predetermined dose by a dispenser W. The side cover 90X may be cured through a subsequent operation. The side cover 90X may be formed of, for example, a non-conductive black resin.

The side cover 90X may be applied to cover all of the rear surface of the front cover 70X, the side surface 45 of the substrate 40, the chamfered portion 49 formed between the mounting surface 41 and the side surface 45, and the chamfered portion 49 formed between the side surface 45 and the rear surface 43.

The dispensing operation of the side cover 90X may be performed on each of the four edges E of the substrate 40.

Accordingly, the side cover 90X may be dispensed to cover the entirety of the side surface 45 of the substrate 40.

The side cover 90X is provided, while being cured, to be bonded to the rear surface of the front cover 70X in the first direction X and the side surface 45 of the substrate 40 and the chamfered portion 49 formed between the side surface 45 and the mounting surface 41.

When the side cover 90X includes a photosensitive material, the side cover 90X may be colored in a dark color by being irradiating with ultraviolet rays or the like as a subsequent operation. However, when the side cover 90X is formed of a translucent or opaque material without including a photosensitive material, the irradiation of ultraviolet rays is not needed.

Next, as shown in FIG. 15, the front cover 70X and the side cover 90X are cut in the first direction X such that at least a portion of the front cover 70X extends to an area outside the substrate 40 in the second direction Y perpendicular to the first direction X in which the mounting surface 41 faces (504).

The cutting process may be performed by laser (L) cutting or the like. Accordingly, the front cover 70X and the side cover 90X may be simultaneously cut.

In the cutting process, the front cover 70X and the side cover 90X may be cut such that the front cover 70X includes the first region 71 not only in the second direction Y but also in the third direction X perpendicular to the first direction X and the second direction Y, and the side cover 90X is disposed in the second direction Y and third direction Z.

That is, the cutting process may be performed on each of the four edges E of the substrate 40.

As shown in FIG. 16, a side end portion 75 of the front cover 70 and a side end portion 91 of the side cover 90 may be formed on the same line in the first direction X by a cutting process. According to embodiments, the side end portion 75 of the front cover 70 and the side end portion 91 of the side cover 90 may be cut to be aligned in a direction parallel to the first direction X.

The first region 71 may be processed such that, when the display module 30 is provided in plural (display modules 30A to 30P) the length of the first region 71 extending outside the mounting surface 41 is equal to or less than half of the gap G formed between the plurality of display modules 30A to 30P.

Next, a metal plate 60 is bonded to the rear surface 43 of the substrate 40 (505).

An adhesive layer 61 is disposed on the upper surface of the metal plate 60 in the first direction X so that when the adhesive layer 61 and the rear surface 43 of the substrate 40 are compressed against each other, the adhesive layer 61 allows the substrate 40 and the metal plate 60 to be bonded to each other.

However, embodiments of the disclosure are not limited thereto, and the adhesive layer 61 may be disposed on the rear surface 43 of the substrate 40, and the metal plate 60 may be compressed against the adhesive layer 61 disposed on the rear surface 43.

In this case, a portion of the side cover 90X dispensed on the rear surface 43 of the substrate 40 may remain, but because the amount of the remaining portion is negligible, the metal plate 60 and the rear surface 43 of the substrate 40 may be bonded approximately in parallel with each other.

Next, the side end member 100X is coated on the side end portion 75 of the front cover 70 and the side end portion 91 of the side cover 90 (506).

The side end member 100X may be formed of a conductive material having a high conductivity. The side end member 100X may be bonded to the side end portion 75 of the front cover 70 and the side end portion 91 of the side cover 90 through coating. Accordingly, the side end member 100X may be provided in the form of a thin film.

The coating operation of the side end member 100X may be performed on each of the four edges E of the substrate 40. Accordingly, the side end member 100X may be coated to cover both the side surface 45 of the substrate 40 and the side cover 90.

Thereafter, as shown FIG. 18, the display module 30 processed as described above may be prepared as a plurality of display modules 30A to 30P, and the plurality of display modules 30A to 30P may be disposed to be adjacent to each other. In this case, the plurality of display modules 30A to 30P may be fixed through a jig. The plurality of display modules 30A to 30P may be arranged in a matrix of M×N.

Accordingly, when the plurality of display modules 30A to 30P are disposed to be adjacent to each other, the plurality of the first region 71 of the plurality of the front cover 70, the plurality of the side cover 90 disposed on the plurality of the side surface 45 of the plurality of the substrate 40, and the plurality of the side end member 100 may be disposed in the plurality of the gap G formed between the plurality of display modules 30A to 30P.

Because the side end portion 75 of the front cover 70 and the side end portion 91 of the side cover 90 are formed on the same line in the first direction X, and the side end member 100 is formed in line with a direction parallel to the first direction X, when the plurality of display modules 30A to 30P are arrayed, the spacing between the display modules 30A to 30P may be minimized.

Although few non-limiting example embodiments of the disclosure have been shown and described, such embodiments are for illustrative purposes only, and it would be appreciated by those skilled in the art that changes and modifications may be made in these embodiments without departing from the principles and scope of the disclosure.

DESCRIPTION OF REFERENCE NUMERALS

| | |
|---|---|
| 1: display apparatus | 20: display panel |
| 30, 30A to 30P: display module | 40: substrate |
| 41: mounting surface | 42: substrate body |
| 43: rear surface | 45: side surface |
| 45: side surface wiring | 46: chamfered portion |
| 50: inorganic LED | 60: metal plate |
| 70: front cover | 80: drive circuit board |
| 90: side cover | 100: side end member |

The invention claimed is:

1. A display module comprising:
a substrate comprising a mounting surface on which a plurality of inorganic light emitting diodes (LEDs) are mounted, a side surface, and a rear surface disposed opposite to the mounting surface;
a front cover bonded to and covering the mounting surface;
a metal plate bonded to the rear surface; and
a side cover configured to surround the side surface,
wherein the front cover extends to an area outside of the mounting surface in a first direction in which the mounting surface extends, and
wherein the side cover is provided to extend, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

2. The display module of claim 1, further comprising a side end member disposed on an outer end of the side cover in the first direction in which the mounting surface extends, and the side end member comprises a material having a conductivity higher than a conductivity of the side cover.

3. The display module of claim 2, wherein one end of the side end member, in the second direction, in which the mounting surface faces is in contact with the metal plate.

4. The display module of claim 3, wherein another end of the side end member, in the second direction, in which the mounting surface faces is in contact with the front cover.

5. The display module of claim 3, wherein the one end of the side end member is in contact with a side end of the metal plate.

6. The display module of claim 4, wherein the one end of the side end member is in contact with a side end of the metal plate in the first direction in which the mounting surface extends, and
the other end of the side end member is in in contact with a side end of the front cover in the first direction in which the mounting surface extends.

7. The display module of claim 1, wherein the side cover comprises a non-conductive material.

8. The display module of claim 7, wherein the side cover comprises a light absorbing material.

9. The display module of claim 1, wherein the side surface is provided to correspond to four edges of the mounting surface,
the front cover is provided to extend to an area outside of the four edges of the mounting surface in directions in which the mounting surface extends, and
the side cover surrounds, outside of the mounting surface in the directions, the side surface and the lower end of the region of the front cover.

10. The display module of claim 9, wherein the side cover extends from the four edges of the mounting surface to four edges of the metal plate, corresponding to the four edges of the mounting surface, such that the side cover surrounds all of the four edges of the metal plate.

11. The display module of claim 1, further comprising a driving circuit board arranged on the metal plate and configured to electrically control the plurality of inorganic LEDs,
wherein the substrate further comprises:
chamfered portions formed between the mounting surface and the side surface and between the rear surface and the side surface, respectively, and
a side surface wiring extending along the side surface and the chamfered portions and configured to electrically connect the plurality of inorganic LEDs to the driving circuit board, and
the side cover surrounds the side surface, the chamfered portions, and the side surface wiring.

12. The display module of claim 1, wherein the substrate further comprises chamfered portions formed between the mounting surface and the side surface and between the rear surface and the side surface, respectively, and
the side cover surrounds an entirety of the chamfered portions.

13. The display module of claim 1, wherein the front cover comprises a first region that is in the area outside the mounting surface in the first direction in which the mounting surface extends, and further comprises a second region disposed on the mounting surface, and the side cover is provided, below the front cover in the second direction, at a position corresponding to the first region and is not provided in the second region.

14. A display apparatus comprising:

a display module array in which a plurality of display modules are horizontally arranged in an M×N matrix, wherein each of the plurality of display modules comprises:

a substrate comprising a mounting surface on which a plurality of inorganic light emitting diodes (LEDs) are mounted, a side surface, and a rear surface disposed opposite to the mounting surface;

a front cover bonded to and covering the mounting surface;

a metal plate bonded to the rear surface; and a side cover configured to surround the side surface, wherein the front cover extends to an area outside of the mounting surface in a first direction in which the mounting surface extends, and wherein the side cover is extends, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

15. The display apparatus of claim 14, wherein each of the plurality of display modules further comprises a side end member disposed on an outer end of the side cover in the first direction in which the mounting surface extends, and the side end member comprises a material having a conductivity higher than a conductivity of the side cover.

16. A method of manufacturing a display module, the method comprising:

obtaining a substrate including a mounting surface on which a plurality of inorganic light emitting diodes (LEDs) are mounted, a side surface, and a rear surface disposed opposite to the mounting surface;

bonding a front cover to the mounting surface such as to cover the mounting surface;

dispensing a side cover to surround the side surface; and bonding a metal plate to the rear surface of the substrate, wherein the front cover extends to an area outside of the mounting surface in a first direction in which the mounting surface extends, and wherein the side cover extends, in a second direction in which the mounting surface faces, from an upper side of the metal plate to a lower end of a region of the front cover to seal the side surface from an outside, and a portion of the side cover provided at the lower end of the region of the front cover is outwards from the mounting surface in the first direction in which the mounting surface extends.

17. The method of claim 16, further comprising:

disposing a side end member on an outer end of the side cover in the first direction in which the mounting surface extends, wherein the side end member includes a material having a conductivity higher than a conductivity of the side cover.

18. The method of claim 16, further comprising:

simultaneously cutting the front cover and the side cover in the second direction, such that at least a part of the front cover and a part of the side cover of the display module remain outside of the mounting surface in the first direction in which the mounting surface extends.

19. The method of claim 17, wherein one end of the side end member, in the second direction, in which the mounting surface faces is in contact with the metal plate.

20. The method of claim 19, wherein another end of the side end member, in the second direction, in which the mounting surface faces is in contact with the front cover.

* * * * *